(12) United States Patent
Iwata et al.

(10) Patent No.: US 9,627,235 B2
(45) Date of Patent: Apr. 18, 2017

(54) SUPPORTING MEMBER SEPARATION METHOD

(71) Applicant: Tokyo Ohka Kogyo Co., Ltd., Kawasaki-shi (JP)

(72) Inventors: Yasumasa Iwata, Kawasaki (JP); Yoshihiro Inao, Kawasaki (JP); Akihiko Nakamura, Kawasaki (JP); Shinji Takase, Kawasaki (JP); Takahiro Yoshioka, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 90 days.

(21) Appl. No.: 14/698,049

(22) Filed: Apr. 28, 2015

(65) Prior Publication Data

US 2015/0325465 A1    Nov. 12, 2015

(30) Foreign Application Priority Data

May 8, 2014  (JP) .................. 2014-097142
Feb. 27, 2015  (JP) .................. 2015-039478

(51) Int. Cl.
| | | |
|---|---|---|
| *H01L 21/683* | (2006.01) | |
| *B32B 43/00* | (2006.01) | |
| *H01L 21/67* | (2006.01) | |
| *B32B 37/02* | (2006.01) | |
| *B32B 38/10* | (2006.01) | |

(Continued)

(52) U.S. Cl.
CPC ........ *H01L 21/67092* (2013.01); *B32B 37/02* (2013.01); *B32B 38/10* (2013.01); *B32B 38/1858* (2013.01); *B32B 43/006* (2013.01); *H01L 21/6836* (2013.01); *B32B 2037/268* (2013.01); *B32B 2307/202* (2013.01);

(Continued)

(58) Field of Classification Search
CPC ..... H01L 2221/68386; Y10T 156/1111; Y10T 156/1158; Y10T 156/1917; Y10S 156/93; Y10S 156/941
See application file for complete search history.

(56) References Cited

U.S. PATENT DOCUMENTS 4,883,561 A * 11/1989 Gmitter .................. B32B 43/00
                                                   117/915
8,038,839 B2 * 10/2011 Noda .................... B32B 43/006
                                                   156/712

(Continued)

FOREIGN PATENT DOCUMENTS

| JP | 11-116046 | 4/1999 |
| JP | 2006-032506 | 2/2006 |

*Primary Examiner* — Mark A Osele
(74) *Attorney, Agent, or Firm* — Knobbe Martens Olson & Bear LLP

(57) ABSTRACT

A supporting member separation method for separating a laminate which is formed by laminating a substrate and a support plate through an adhesive layer and in which a release layer is provided on at least a part of the peripheral portion on the surface of the side of the substrate facing the support plate or the peripheral portion on the surface of the side of the support plate facing the substrate, the method including reducing the adhesive force of at least a part of the release layer which is provided on the peripheral portion of the substrate or the support, and fixing a part in the substrate and the support plate and separating the support plate from the substrate by applying a force to another part, after the preliminary treatment.

13 Claims, 4 Drawing Sheets

(51) Int. Cl.
*B32B 38/18* (2006.01)
*B32B 37/26* (2006.01)

(52) U.S. Cl.
CPC ............... *B32B 2310/0825* (2013.01); *B32B 2310/0843* (2013.01); *B32B 2311/00* (2013.01); *B32B 2313/00* (2013.01); *B32B 2457/14* (2013.01); *H01L 2221/68386* (2013.01); *Y10S 156/93* (2013.01); *Y10S 156/941* (2013.01); *Y10T 156/1111* (2015.01); *Y10T 156/1158* (2015.01); *Y10T 156/1189* (2015.01); *Y10T 156/1917* (2015.01)

(56) References Cited

U.S. PATENT DOCUMENTS

| | | | | |
|---|---|---|---|---|
| 8,443,864 B2* | 5/2013 | Thallner | ........... | H01L 21/67092 156/703 |
| 8,701,734 B2* | 4/2014 | Nakamura | ........ | H01L 21/67011 156/701 |
| 8,729,673 B1* | 5/2014 | Okandan | ............. | H01L 21/6835 257/618 |
| 8,852,391 B2* | 10/2014 | McCutcheon | ........ | H01L 21/187 156/714 |
| 9,238,357 B2* | 1/2016 | Takase | .................. | B32B 43/006 |
| 9,272,501 B2* | 3/2016 | Burggraf | ........... | H01L 21/67092 |
| 9,308,715 B2* | 4/2016 | Imai | ....................... | B32B 38/10 |
| 2008/0302481 A1* | 12/2008 | Berger | .................... | B32B 37/06 156/712 |
| 2013/0014905 A1* | 1/2013 | Nakazawa | ............ | B32B 43/006 156/712 |
| 2014/0318697 A1* | 10/2014 | Tan | ........................ | H01L 21/673 156/247 |
| 2016/0343601 A1* | 11/2016 | Ishida | ..................... | B32B 37/06 |
| 2016/0351431 A1* | 12/2016 | Nakajima | ............ | H01L 21/6836 |
| 2016/0361907 A1* | 12/2016 | Luo | .......................... | B32B 37/12 |

\* cited by examiner

SUPPORTING MEMBER SEPARATION METHOD

CROSS-REFERENCE TO RELATED APPLICATIONS

Priority is claimed on Japanese Patent Application No. 2014-097142, filed May 8, 2014, and Japanese Patent Application No. 2015-039478, filed Feb. 27, 2015, the contents of which are incorporated herein by reference.

BACKGROUND OF THE INVENTION

Field of the Invention

The present invention relates to a supporting member separation method for separating a laminate formed by laminating a substrate and a support through an adhesive layer.

Background Art

In recent years, thinning, miniaturization, and weight reduction of electronic devices such as an IC card or a cellular phone have been required. To meet these requirements, it is required that thin semiconductor chips be also used as the semiconductor chips incorporated. For this reason, though a thickness (film thickness) of a wafer substrate which is a base of the semiconductor chip is 125 µm to 150 µm at present, it is known that a thickness of 25 µm to 50 µm is required to be used in the chip for the next generation. Therefore, to obtain the wafer substrate having the film thickness described above, a thinning step of the wafer substrate is essential.

Since the strength of the wafer substrate is reduced by thinning, to prevent a thinned wafer substrate from being damaged, during a manufacturing process, a structure such as a circuit is mounted on the wafer substrate while being automatically carried in a state in which a support plate is bonded to the wafer substrate. Then, after the manufacturing process, the wafer substrate is separated from the support plate. Therefore, various methods for stripping a support from a wafer have been used thus far.

In Japanese Unexamined Patent Application, Publication No. 2006-32506 (publication date: Feb. 2, 2006), a stripping method of a semiconductor wafer which is a method for stripping a semiconductor wafer which is stuck to a support having rigidity through a sticking material and which includes an insertion step of inserting an insertion member into a sticking material and a vibration step of applying vibration to a sticking material during the force application in the direction of stripping a semiconductor wafer from a support is described.

In Japanese Unexamined Patent Application, Publication No. H11-116046 (publication date: Apr. 27, 1999), a robot hand of a wafer carrying robot which is connected to an arm body which is rotatably disposed on a machine base and carries a wafer by gripping a wafer, and which is configured to have a gripping portion for gripping the outer peripheral surface of a wafer is described.

SUMMARY OF THE INVENTION

In the separation method of a substrate and a support described in Japanese Unexamined Patent Application, Publication No. 2006-32506, a substrate and a support are stripped by inserting a blade into an adhesive layer. Thus, when the blade is brought into contact with the substrate of a laminate, there is concern that the substrate may be damaged.

In addition, Japanese Unexamined Patent Application, Publication No. H11-116046 does not disclose a supporting member separation method capable of preventing a substrate from being damaged when the substrate and a support are separated.

The present invention has been accomplished in consideration of the above-described problem, and an object of the present invention is to provide a supporting member separation method capable of preventing a substrate from being damaged when the substrate and a support are separated.

The supporting member separation method according to the present invention to solve the above problem is a supporting member separation method for separating a laminate which is formed by laminating a substrate and a support which supports the substrate through an adhesive layer and in which a release layer is provided on at least a part of the peripheral portion on the surface of the side of the substrate facing the support or at least a part of the peripheral portion on the surface of the side of the support facing the substrate, and includes a preliminary treatment step of reducing the adhesive force of at least a part of the release layer which is provided on the peripheral portion of the substrate or the support, and a separation step of fixing a part of the substrate and the support and separating the support from the substrate by applying a force to another part, after the preliminary treatment step.

In addition, specifically, the supporting member separation method according to the present invention is a supporting member separation method for separating a laminate which is formed by laminating a substrate, an adhesive layer, and a support in which a release layer is provided on at least a part of the peripheral portion on the surface of the side facing the substrate, in this order, and includes a preliminary treatment step of reducing the adhesive force of at least a part of the release layer which is provided on the peripheral portion of the support, and a separation step of fixing a part of the substrate and the support and separating the support from the substrate by applying a force to another part, after the preliminary treatment step.

The present invention exhibits an effect that it is possible to prevent a substrate from being damaged when the substrate and a support are separated.

BRIEF DESCRIPTION OF THE DRAWINGS (a) to (g) of FIG. 1 are diagrams illustrating an outline of a supporting member separation method according to one embodiment of the present invention.

Figure 4:
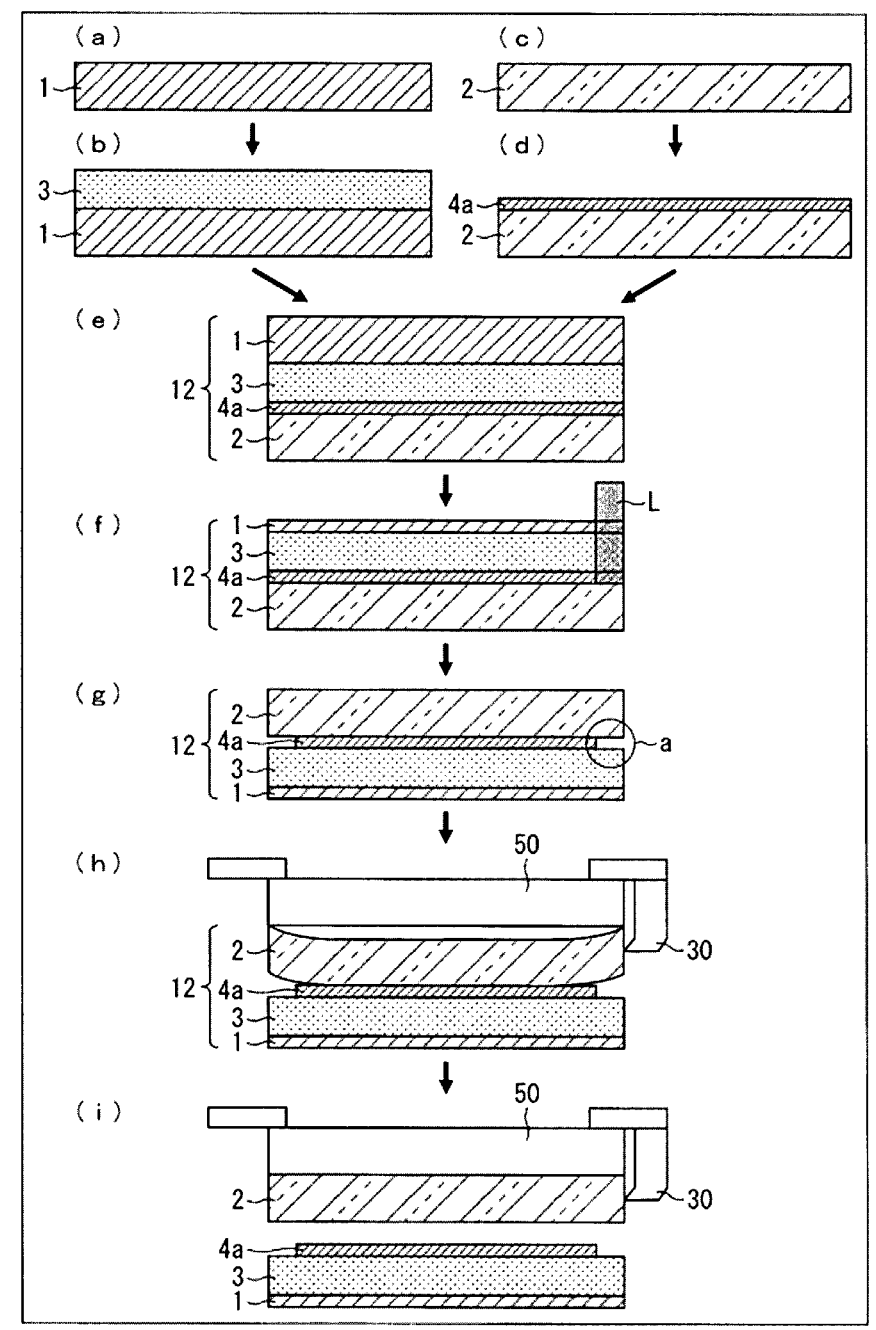

(a) to (i) of FIG. 4 are diagrams illustrating an outline of a manufacturing method of a laminate used in the supporting member separation method according to one embodiment of the present invention and a supporting member separation method using the laminate.

Figure 5:
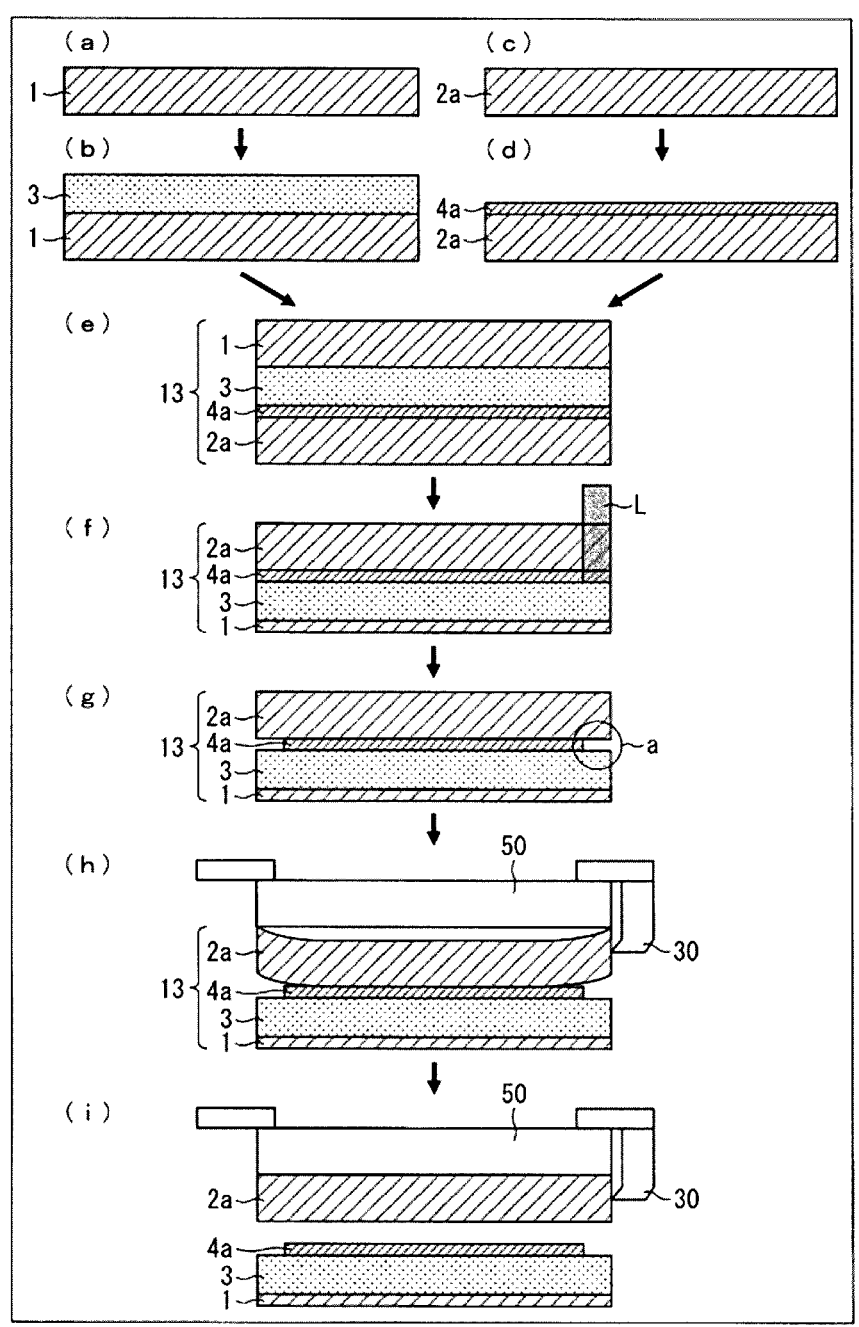

(a) to (i) of FIG. 5 are diagrams illustrating an outline of a manufacturing method of a laminate used in the supporting member separation method according to one embodiment of the present invention and a supporting member separation method using the laminate.

DETAILED DESCRIPTION OF THE INVENTION

First Embodiment

A supporting member separation method according to the present invention is a supporting member separation method for separating a laminate which is formed by laminating a substrate and a support which supports the substrate through an adhesive layer and in which a release layer is provided on at least a part of the peripheral portion on the surface of the side of the substrate facing the support or at least a part of the peripheral portion on the surface of the side of the support facing the substrate, and includes a preliminary treatment step of reducing the adhesive force of at least a part of the release layer which is provided on the peripheral portion of the substrate or the support, and a separation step of fixing a part of the substrate and the support and separating the support from the substrate by applying a force to another part, after the preliminary treatment step.

Moreover, a release layer may be provided on at least a part of the peripheral portion on the surface of the side of the substrate facing the support or at least a part of the peripheral portion on the surface of the side of the support facing the substrate, however, in the present embodiment, an embodiment in which a release layer is provided on at least a part of the peripheral portion on the surface of the side of the support facing the substrate, specifically, an embodiment which is a supporting member separation method for separating a laminate which is formed by laminating a substrate, an adhesive layer, and a support in which a release layer is provided on at least a part of the peripheral portion on the surface of the side facing the substrate, in this order and which includes a preliminary treatment step of reducing the adhesive force of at least a part of the release layer which is provided on the peripheral portion of the support, and a separation step of fixing a part of the substrate and the support and separating the support from the substrate by applying a force to another part, after the preliminary treatment step will be described.

The supporting member separation method according to one embodiment (First embodiment) will be described in more detail with reference to FIG. 1.

Figure 1:
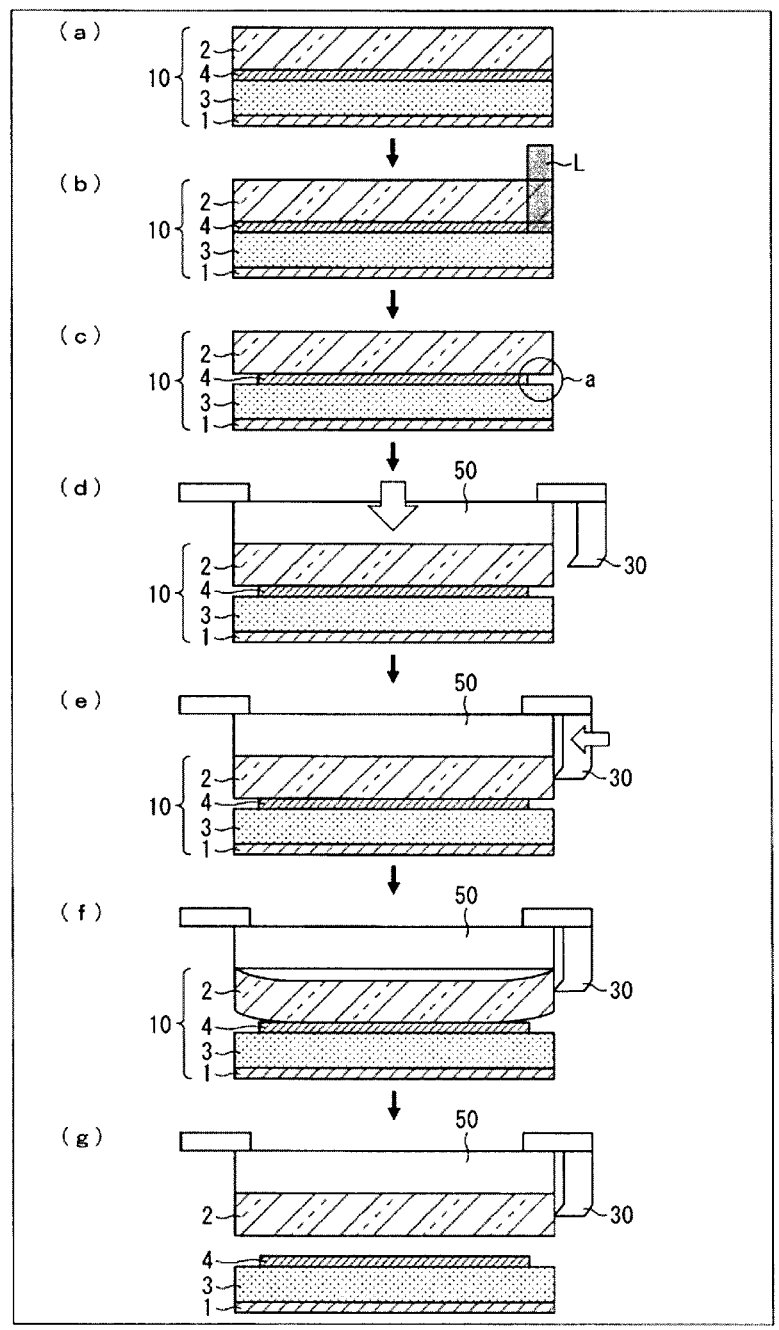

As shown in (a) of FIG. 1, in the supporting member separation method according to the embodiment, a laminate 10 having a support plate (support) 2 on which a release layer 4 is provided on the entire surface of the side facing a substrate 1 is separated.

In addition, as shown in (b) and (c) of FIG. 1, the laminate 10 has the support plate 2 formed of a material that transmits light and the release layer 4 which is altered by absorbing light L.

As shown in (a) to (c) of FIG. 1, the supporting member separation method according to the embodiment includes the preliminary treatment step of reducing the adhesive force of the release layer 4 which is provided on the entire perimeter of the peripheral portion of the support plate 2. In the preliminary treatment step, the release layer 4 is altered by irradiation with light through the support plate 2, and due to this, the adhesive force is reduced.

As shown in (d) to (g) of FIG. 1, the supporting member separation method according to the embodiment includes the separation step of fixing the substrate 1 among the substrate 1 and the support plate 2 and separating the support plate 2 from the substrate 1 by applying a force to the support plate 2 which is another part, after the preliminary treatment step.

According to the above configuration, in the preliminary treatment step, by irradiating the release layer 4 which is provided on the side of the support plate 2 facing the substrate 1 included in the laminate 10 with light such as a laser, it is possible to suitably reduce the adhesive force of the release layer 4. Therefore, it is possible to reduce the adhesive force between the support plate 2 and an adhesive layer 3 without inserting a blade or the like into the adhesive layer 3 formed between the support plate 2 and the substrate 1. Thus, it is possible to prevent the substrate 1 from being damaged by contact of a blade or the like with the substrate 1.

In addition, since the adhesive force of the release layer 4 of the support plate 2 is reduced, in the separation step, when a part of the substrate 1 is fixed and a force is applied to the support plate 2, the force can be easily concentrated on the portion of the release layer 4 in which the adhesive force is reduced. Thus, it is possible to separate the support plate 2 from the substrate 1 while preventing an excessive force from being applied to the substrate 1.

Preliminary Treatment Step

In the preliminary treatment step, the laminate 10 is set on a mounting table (not shown) ((a) of FIG. 1), and, subsequently, the entire perimeter of the peripheral portion of the release layer 4 which is provided to the entire surface of the support plate 2 is irradiated with light through the support plate 2 ((b) of FIG. 1). Thus, the release layer 4 which is provided on the entire perimeter of the peripheral portion of the support plate 2 of the laminate 10 is altered, and due to this, the adhesive force is reduced ((c) of FIG. 1).

As shown in (a) of FIG. 1, in the preliminary treatment step, the laminate 10 is set on the mounting table (not shown) such that the substrate 1 side of the laminate 10 is positioned on the bottom surface side.

In the preliminary treatment step, as the mounting table on which the laminate is set, a stage capable of fixing the laminate 10 by sucking using a decompression means is preferable. As an example of the mounting table, a fixed or movable stage equipped with a porous portion or the like so as not to damage thinned wafers can be mentioned. In addition, as the decompression means, which is not particularly limited, for example, an air-driven type vacuum generator is preferably used.

In addition, the laminate 10 may be set on a mounting table such as a stage equipped with the above-described mechanism or a spin chuck through a dicing tape equipped with a dicing frame.

Irradiation with Light

As shown in (b) of FIG. 1, in the preliminary treatment step included in the supporting member separation method according to the embodiment, the release layer 4 is altered by irradiation with light through the support plate 2, and due to this, the adhesive force is reduced. In addition, as shown in a region a in (c) of FIG. 1, in the preliminary treatment step, the adhesive force of the release layer 4 on the entire perimeter of the peripheral portion of the support plate 2 is reduced.

Moreover, in the specification, the term "alter" used for the release layer refers to a phenomenon in which the release layer becomes a state in which the release layer may be broken by a slight external force, or a state in which the adhesive force between the release layer and the layers in contact with the release layer is decreased. As a result of alteration of the release layer generated by absorbing light, the release layer loses the strength or the adhesive properties it used to have before being irradiated with light. That is, by absorbing light, the release layer 4 becomes brittle. "Alteration" of the release layer can be that in the substances constituting the release layer, decomposition, change in the configuration thereof, or dissociation of the functional group thereof occurs by the energy of the light absorbed. The alteration of the release layer 4 occurs as a result of absorption of light.

Accordingly, by altering the release layer so as to be broken, for example, by only lifting the support plate, it is possible to easily separate the support plate from the substrate. More specifically, for example, using a supporting member separation apparatus or the like, one of the substrate and the support plate of the laminate is fixed on the mounting table, and the support plate may be separated from the substrate by holding and lifting another one by a suction pad (a holding means) having a suction means, or the support plate may be separated from the substrate by applying a force by gripping the beveled portion of the end portion of the peripheral portion of the support plate by a release plate having a clamp (claw portion) or the like. In addition, for example, the support plate may be stripped from the substrate of the laminate using the supporting member separation apparatus equipped with a stripping means which supplies a stripping solution for stripping the adhesive. The adhesive layer of the laminate swells by supplying the stripping solution to at least a part of the peripheral end portion of the adhesive layer of the laminate by the stripping means, then, a force is concentrated on the release layer from the place where the adhesive layer swelled, and as a result, a force can be applied to the substrate and the support plate. Thus, it is possible to suitably separate the support plate from the substrate.

Moreover, the force applied from the outside with respect to the laminate, that is, the external force, may be suitably adjusted depending on the size of the laminate or a material of a support such as glass or silicon. Although the force is not limited, in the case of a laminate having a diameter of about 300 mm, the force is, for example, about 0.1 kgf to 5 kgf. By applying an external force of about 0.1 kgf to 5 kgf, it is possible to suitably separate the support plate from the substrate.

Examples of the laser for emitting light with which the release layer 4 is irradiated include laser lights such as solid lasers including a YAG laser, a ruby laser, a glass laser, a $YVO_4$ laser, an LD laser, a fiber laser, and the like, liquid lasers including a dye laser and the like, gas lasers including a $CO_2$ laser, an excimer laser, an Ar laser, a He—Ne laser, and the like, a semiconductor laser, and a free electron laser, or non-laser lights. A laser for emitting light with which the release layer 4 is irradiated can be suitably selected depending on materials constituting the release layer 4, and a laser that emits light having a wavelength that can alter materials constituting the release layer 4 may be selected.

In the preliminary treatment step, in the case of setting the laminate 10 using a spin chuck as a mounting table, by irradiating with light while rotating the laminate 10, it is possible to suitably alter the release layer 4 which is provided on the entire perimeter of the peripheral portion of the support plate 2 of the laminate 10. Thus, in any of the entire perimeter of the peripheral portion of the laminate 10, it is possible to reduce the adhesive force between the adhesive layer 3 and the support plate 2. Moreover, in the preliminary treatment step, the method of irradiating with light to alter the release layer 4 provided on the entire perimeter of the peripheral portion of the laminate is not limited to the aspect of irradiating with light while rotating the laminate 10. The method of irradiating with light, for example, may be a method in which the laminate 10 is fixed on a mounting table, and a laser light irradiation means is moved such that the entire perimeter of the peripheral portion of the laminate 10 fixed is irradiated with light, and may be a method in which the mounting table to which the laminate 10 is fixed is moved such that the entire perimeter of the peripheral portion of the laminate 10 is irradiated with light emitted from the laser light irradiation means.

In addition, in the preliminary treatment step, as shown in a region a in (c) of FIG. 1, it is preferable to reduce the adhesive force of the release layer 4 present within a range of 3 mm or less, it is more preferable to reduce the adhesive force of the release layer 4 present within a range of 2 mm or less, and it is most preferable to reduce the adhesive force of the release layer 4 present within a range of 1.5 mm or less, toward the inside from the end portion of the peripheral portion of the support plate 2.

In a case where the adhesive force of the release layer 4 present within a range of 3 mm or less toward the inside from the end portion of the peripheral portion of the support plate 2 is reduced, when separating the support plate 2 from the substrate 1, it is possible to concentrate a force on the release layer 4 in which the adhesive force was reduced. In addition, it is possible to narrow the range in which the substrate 1 is irradiated with the laser light which was transmitted through the support plate 2 and the release layer 4. Therefore, it is possible to narrow the range in which the substrate 1 is damaged by the laser light. Accordingly, thereafter, by performing a desired treatment, it is possible to manufacture a semiconductor chip from the substrate 1 with a high yield.

In addition, in the preliminary treatment step, the adhesive force of a part of the release layer 4 may be reduced to the extent that a force is concentrated on the release layer 4 provided on the peripheral portion of the support plate 2, and for example, it is preferable to reduce the adhesive force of the release layer 4 present within a range of at least 1.5 mm or greater toward the inside from the end portion of the peripheral portion of the support plate 2.

Separation Step

In the separation step, a part of the substrate 1 is fixed ((d) of FIG. 1), and a force is applied by gripping the beveled portion of the end portion of the peripheral portion of the support plate 2 by a release plate 50 having a clamp (claw portion) 30 ((e) and (f) of FIG. 1). Thus, the support plate 2 is separated from the substrate 1 ((g) of FIG. 1).

In addition, the release plate 50 more preferably has a floating joint (not shown), as an example. The floating joint can move so as to take a circular orbit parallel to the plane of the laminate 10 and an arc shape trajectory perpendicular to the plane of the laminate 10, and using this, it is possible to freely tilt the release plate 50.

The substrate 1 side of the laminate 10 is sucked from a mounting table such as a spin chuck having a porous portion, and as a result, the laminate 10 is fixed. Here, as the decompression means, known means can be used. Although the decompression means is not limited, if a vacuum pump is used as the decompression means, it is possible to more strongly fix the substrate 1 to the porous portion of the mounting table.

The release plate 50 can move right and left on the laminate 10, and can vertically move. First, the release plate 50 moves on the laminate 10, and subsequently, descends to a position where the support plate 2 can be gripped ((d) of FIG. 1).

Next, as shown in (e) of FIG. 1, the clamp (claw portion) 30 of the release plate 50 grips the beveled portion of the end portion of the peripheral portion of the support plate 2. Thus, it is possible to apply a force to the support plate 2 of the laminate 10 of which the substrate 1 side is fixed to the mounting table.

In the separation step, it is preferable to grip the beveled portion of the end portion of the peripheral portion of the support plate 2 by the release plate 50 having two to six clamps 30, and it is more preferable to grip the beveled portion of the end portion of the peripheral portion of the support plate 2 by the release plate 50 having three to five clamps 30. In addition, the clamps 30 are preferably provided on the peripheral portion of the surface of the release plate 50 facing the laminate 10 at an equal interval.

When the beveled portion of the end portion of the peripheral portion of the support plate 2 is gripped by two to six clamps 30, it is possible to apply a force to the laminate 10 without detaching the laminate 10 in the separation step.

Next, as shown in (f) of FIG. 1, the release plate 50 ascends in a state of gripping the support plate 2 of the laminate 10 by the clamp 30. Thus, a force is applied to the laminate 10. In addition, as shown in (f) of FIG. 1, it is possible to bend the support plate 2 by elevating it in a state of gripping the beveled portion of the end portion of the peripheral portion of the support plate 2 by the release plate 50. Thus, the force applied to the laminate 10 from the release plate 50 can be easily concentrated on, in particular, the release layer 4 from which the peripheral portion has been removed. That is, it is possible to separate the support plate 2 from the substrate 1 by concentrating a force on the release layer 4 having a lower adhesive force compared to the adhesive layer 3. Accordingly, it is possible to separate the support plate 2 from the substrate 1 with a smaller force than that in the case of using the laminate in which the release layer 4 was not formed on the support plate 2.

In addition, in the separation step, a force may be applied to the laminate 10 from the release plate 50 through the floating joint or the like. In a case of applying a force to the laminate 10 from the release plate through the floating joint, when the force is concentrated on only a part of the portion from which the adhesive layer 3 was removed, the floating joint moves, the release plate 50 is tilted, and as a result, the support plate 2 is tilted. Thus, it is possible to prevent an excessive force from being applied to a part of the support plate 2 and the substrate 1. Accordingly, it is possible to more suitably strip the support plate 2 from the substrate 1 while preventing the support plate 2 and the substrate 1 from being damaged by an excessive force.

Here, the release plate 50 preferably ascends at a speed of 0.05 mm/s to 0.5 mm/s and more preferably ascends at a speed of 0.1 mm/s to 0.2 mm/s, in a state of gripping the support plate 2.

When the release plate 50 ascends at a speed of 0.05 mm/s to 0.5 mm/s in a state of gripping the support plate 2, it is possible to prevent an excessive force from being applied at once to the support plate 2 and the substrate 1. Therefore, it is possible to interface-strip the substrate 1 and the support plate 2 at the interface between the support plate 2 and the release layer 4 ((e) and (f) of FIG. 1). In addition, since it is possible to prevent an excessive force from being applied at once to the support plate 2 and the substrate 1, it is possible to prevent the substrate 1 and the support plate 2 from being destroyed.

As shown in (g) of FIG. 1, after the support plate 2 is separated from the substrate 1 in the separation step, the residues of the adhesive layer 3 and the release layer 4 remaining on the surface of the substrate 1 is removed by washing, and a desired treatment may be performed on the substrate 1. For example, after the support plate 2 is separated, the substrate 1 is washed, and a semiconductor chip can be manufactured from the substrate 1 by dicing.

Laminate 10

Figure 2A:
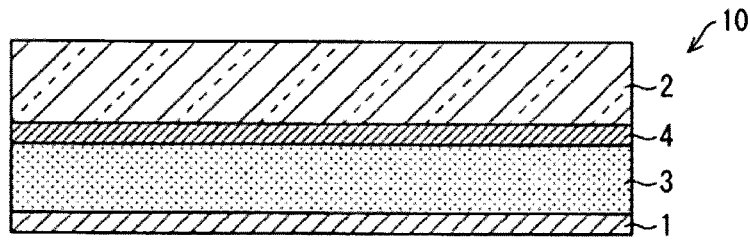
FIGS. 2A and 2B are diagrams illustrating an outline of a laminate used in the supporting member separation method according to one embodiment of the present invention and a laminate according to one modified example.

Hereinafter, the laminate 10 used in the supporting member separation method according to the embodiment will be described in more detail with reference to FIG. 2A. As shown in FIG. 2A, the laminate 10 is formed by laminating the substrate 1, the adhesive layer 3 including, for example, a thermoplastic resin, and the support plate 2 in which the release layer 4 which is altered by irradiation with light is provided on the surface of the side facing the substrate 1, in this order.

Substrate 1

The substrate 1 is attached to the support plate 2 on which the release layer 4 is provided through the adhesive layer 3. In addition, the substrate 1 can be subjected to processes such as thinning and mounting in a state of being supported by the support plate 2. As the substrate 1, besides a silicon wafer substrate, any substrate such as a ceramic substrate, a thin film substrate, and a flexible substrate can be used.

Support Plate 2

The support plate (support) 2 is a support which supports the substrate 1, and is attached to the substrate 1 through the adhesive layer 3. Thus, the support plate 2 may have a strength necessary for preventing the substrate 1 from being damaged or deformed at the time of performing a process such as thinning, carrying, or mounting of the substrate 1. In addition, the support plate 2 may be a support plate which transmits light for altering the release layer. From the viewpoints as described above, as the support plate 2, plates formed of glass, silicon, and an acryl-based resin can be exemplified.

Adhesive Layer 3

The adhesive layer 3 is a layer formed of an adhesive used for attaching the support plate 2 to the substrate 1.

As the adhesive, for example, various adhesives known in the art such as an acryl-based adhesive, a novolac-based adhesive, a naphthoquinone-based adhesive, a hydrocarbon-based adhesive, a polyimide-based adhesive, and an elastomer can be used as an adhesive constituting the adhesive layer 3 according to the present invention. Hereinafter, a composition of a resin which is contained in the adhesive layer 3 in the present embodiment will be described.

The resin contained in the adhesive layer 3 is not limited as long as the resin may have adhesive properties, and examples of the resin include a hydrocarbon resin, an acryl-styrene-based resin, a maleimide-based resin, an elastomer resin, a polysulfone-based resin, and combinations of these.

The glass transition temperature (Tg) of the adhesive varies depending on the type and the molecular weight of the above resin, and a material mixed to the adhesive such as a plasticizer or the like. The type and the molecular weight of the resin contained in the adhesive can be suitably selected depending on the type of the substrate or the support, and Tg of the resin used in the adhesive is preferably within a range of −60° C. to 200° C., and more preferably within a range of −25° C. to 150° C. When Tg of the resin used in the adhesive is within a range of −60° C. to 200° C., it is possible to preferably reduce the adhesive force of the adhesive layer 3 without the need for excessive energy for cooling. In addition, Tg of the adhesive layer 3 may be suitably adjusted by mixing a plasticizer, a resin with a low degree of polymerization, or the like.

For example, the glass transition temperature (Tg) can be measured by a known differential scanning calorimeter (DSC).

Hydrocarbon Resin

The hydrocarbon resin is a resin having a hydrocarbon skeleton and formed by polymerizing a monomer composition. Examples of the hydrocarbon resin include a cycloolefin-based polymer (hereinafter, also referred to as "resin (A)"), or at least one resin (hereinafter, also referred to as "resin (B)") selected from the group consisting of a terpene-based resin, a rosin-based resin, and a petroleum resin, but the hydrocarbon resin is not limited thereto.

The resin (A) may be a resin formed by polymerizing monomer components including cycloolefin-based monomers. Specifically, a ring-opened (co)polymer of a monomer component including the cycloolefin-based monomer and a resin obtained by addition-(co)polymerizing the monomer component including the cycloolefin-based monomer can be mentioned.

Examples of the cycloolefin-based monomer included in the monomer component constituting the resin (A) include bicyclic compounds such as norbornene and norbornadiene, tricyclic compounds such as dicyclopentadiene and hydroxy dicyclopentadiene, tetracyclic compounds such as tetracyclododecene, pentacyclic compounds such as a cyclopentadiene trimer, heptacyclic compounds such as tetracyclopentadiene, or alkyl (such as methyl, ethyl, propyl, or butyl) substituents, alkenyl (such as vinyl) substituents, alkylidene (such as ethylidene) substituents, and aryl (such as phenyl, tolyl, or naphthyl) substituents of the polycyclic compounds. Among these, in particular, norbornene, tetracyclododecene, or a norbornene-based monomer selected from the group consisting of alkyl substituents of norbornene or tetracyclododecene is preferable.

The monomer component constituting the resin (A) may contain other monomers which can be copolymerized with the above-described cycloolefin-based monomers, and preferably contains an alkene monomer, for example. Examples of the alkene monomer include ethylene, propylene, 1-butene, isobutene, 1-hexene, and α-olefin. The alkene monomer may be linear or branched.

In addition, the cycloolefin monomer is preferably contained as the monomer component constituting the resin (A) from the viewpoint of a high heat resistance (poor pyrolytic properties and thermal weight loss properties). A ratio of the cycloolefin monomer with respect to all the monomer components constituting the resin (A) is preferably 5 mol % or greater, more preferably 10 mol % or greater, and still more preferably 20 mol % or greater. In addition, the ratio of the cycloolefin monomer with respect to all the monomer components constituting the resin (A), which is not particularly limited, is preferably 80 mol % or less, and more preferably 70 mol % or less from the viewpoint of solubility and exposure stability in a solution.

In addition, the monomer components constituting the resin (A) may contain linear or branched alkene monomers. The ratio of the alkene monomer with respect to all the monomer components constituting the resin (A) is preferably 10 mol % to 90 mol %, more preferably 20 mol % to 85 mol %, and still more preferably 30 mol % to 80 mol % from the viewpoint of solubility and flexibility.

Moreover, it is preferable that the resin (A), for example, as a resin formed by polymerizing monomer components consisting of cycloolefin-based monomers and alkene monomers, is a resin having no polar group to suppress the generation of gas at high temperature.

The polymerization method and the polymerization conditions when the monomer component is polymerized are not particularly limited, and may be suitably set according to common methods.

Examples of commercially available products that can be used as the resin (A) include "TOPAS" manufactured by POLYPLASTICS Co., Ltd., "APEL" manufactured by Mitsui Chemicals, Inc., "ZEONOR" and "ZEONEX" manufactured by ZEON CORPORATION, and "ARTON" manufactured by JSR Corporation.

The glass transition temperature (Tg) of the resin (A) is preferably 60° C. or higher, and particularly preferably 70° C. or higher. In a case where the glass transition temperature of the resin (A) is 60° C. or higher, when the laminate is exposed to a high temperature environment, it is possible to further suppress softening of the adhesive layer 3.

The resin (B) is at least one resin selected from the group consisting of a terpene-based resin, a rosin-based resin, and a petroleum resin. Specifically, examples of the terpene-based resin include a terpene resin, a terpene phenol resin, a denatured terpene resin, a hydrogenated terpene resin, and a hydrogenated terpene phenol resin. Examples of the rosin-based resin include rosin, a rosin ester, hydrogenated rosin, a hydrogenated rosin ester, polymerized rosin, a polymerized rosin ester, and denatured rosin. Examples of the petroleum resin include an aliphatic or aromatic petroleum resin, a hydrogenated petroleum resin, a denatured petroleum resin, an alicyclic petroleum resin, and a coumarone-indene petroleum resin. Among these, a hydrogenated terpene resin, and a hydrogenated petroleum resin are more preferable.

A softening point of the resin (B), which is not particularly limited, is preferably 80° C. to 160° C. In a case where the softening point of the resin (B) is 80° C. to 160° C., when the laminate is exposed to a high temperature environment, it is possible to suppress softening, and an adhesive failure does not occur.

The weight average molecular weight of the resin (B), which is not particularly limited, is preferably 300 to 3,000. When the weight average molecular weight of the resin (B) is 300 or greater, the heat resistance becomes sufficient, and the amount of degasification is reduced under a high temperature environment. On the other hand, in a case where the weight average molecular weight of the resin (B) is 3,000 or less, the dissolution rate of the adhesive layer in a hydrocarbon-based solvent becomes excellent. Therefore, it is possible to quickly dissolve and remove the residue of the adhesive layer on the substrate after separating the support. Moreover, the weight average molecular weight of the resin (B) in the embodiment means a molecular weight in terms of polystyrene measured by using gel permeation chromatography (GPC).

Moreover, as the resin, a mixture of the resins (A) and (B) may be used. By mixing the resins, the heat resistance becomes excellent. For example, the mixing ratio between the resin (A) and the resin (B) is preferably (A):(B)=80:20 to 55:45 (mass ratio) since the heat resistance under the high temperature environment, and flexibility are excellent at this ratio.

Acryl-Styrene-Based Resin

Examples of the acryl-styrene-based resin include resins which are polymerized using styrene or styrene derivatives, and (meth)acrylic acid esters as a monomer.

Examples of the (meth)acrylic acid ester include (meth)acrylic acid alkyl esters formed of a chain structure, (meth)acrylic acid esters having an aliphatic ring, and (meth)acrylic acid esters having an aromatic ring. Examples of the (meth)acrylic acid alkyl esters formed of a chain structure include acryl-based long chain alkyl esters having an alkyl group having 15 to 20 carbon atoms, and acryl-based alkyl esters having an alkyl group having 1 to 14 carbons. Examples of the acryl-based long chain alkyl ester include alkyl esters of acrylic acid or methacrylic acid in which the alkyl group is an n-pentadecyl group, an n-hexadecyl group, an n-heptadecyl group, an n-octadecyl group, an n-nonadecyl group, or an n-eicosyl group. Moreover, the alkyl group may be branched.

Examples of the acryl-based alkyl ester having an alkyl group having 1 to 14 carbon atoms include known acryl-based alkyl esters used in an existing acryl-based adhesive. For example, alkyl esters of acrylic acid or methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, and a tridecyl group are mentioned.

Examples of the (meth)acrylic acid ester having an aliphatic ring include cyclohexyl (meth)acrylate, cyclopentyl (meth)acrylate, 1-adamantyl (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate, and among these, isobornyl methacrylate and dicyclopentanyl (meth)acrylate are more preferable.

The (meth)acrylic acid ester having an aromatic ring is not particularly limited, and examples of the aromatic ring include a phenyl group, a benzyl group, a tolyl group, a xylyl group, a biphenyl group, a naphthyl group, an anthracenyl group, a phenoxymethyl group, and a phenoxyethyl group. In addition, the aromatic ring may have a linear or a branched alkyl group having 1 to 5 carbon atoms. Specifically, phenoxyethyl acrylate is preferable.

Maleimide-Based Resin

Examples of the maleimide-based resin include resins obtained by polymerizing maleimides having an alkyl group such as N-methyl maleimide, N-ethyl maleimide, N-n-propyl maleimide, N-isopropyl maleimide, N-n-butyl maleimide, N-isobutyl maleimide, N-sec-butyl maleimide, N-tert-butyl maleimide, N-n-pentyl maleimide, N-n-hexyl maleimide, N-n-heptyl maleimide, N-n-octyl maleimide, N-lauryl maleimide, and N-stearyl maleimide; maleimides having an aliphatic hydrocarbon group such as N-cyclopropyl maleimide, N-cyclobutyl maleimide, N-cyclopentyl maleimide, N-cyclohexyl maleimide, N-cycloheptyl maleimide, and N-cyclooctyl maleimide; and aromatic maleimides having an aryl group such as N-phenyl maleimide, N-m-methyl phenyl maleimide, N-o-methyl phenyl maleimide, and N-p-methyl phenyl maleimide, as a monomer.

For example, it is possible to use a cycloolefin copolymer which is a copolymer having a repeating unit represented by the following Chemical formula (1) and a repeating unit represented by the following Chemical formula (2), as a resin of an adhesive component.

[Chemical formula 1]

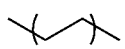

(1)

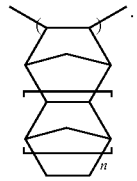

(2)

(In Chemical formula (2), n represents an integer of 0 or 1 to 3.)

As the cycloolefin copolymer, APL 8008T, APL 8009T, and APL 6013T (all manufactured by Mitsui Chemicals, Inc.) can be used.

Elastomer

An elastomer preferably includes a styrene unit as a structural unit of a main chain, and the "styrene unit" may have a substituent. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group. In addition, the content of the styrene unit is more preferably within a range of 14% by weight to 50% by weight. Furthermore, the weight average molecular weight of the elastomer is preferably within a range of 10,000 to 200,000.

When the content of the styrene unit is within a range of 14% by weight to 50% by weight and the weight average molecular weight of an elastomer is within a range of 10,000 to 200,000, the adhesive layer can be removed more easily and quickly since the elastomer is easily dissolved in hydrocarbon-based solvents described below. In addition, when the content of the styrene unit and the weight average molecular weight are within the above-described ranges, an excellent resistance is exhibited with respect to resist solvents (for example, PGMEA, PGME, and the like), acids (hydrofluoric acid and the like), and alkali (TMAH and the like), to which the wafer is exposed when it is subjected to a resist lithography step.

Moreover, the above-described (meth)acrylic acid ester may be further mixed in the elastomer.

In addition, the content of the styrene unit is more preferably within a range of 17% by weight to 40% by weight.

The weight average molecular weight is more preferably within a range of 20,000 to 150,000.

As the elastomer, various elastomers of which the content of the styrene unit is within a range of 14% by weight to 50% by weight, and of which the weight average molecular weight is within a range of 10,000 to 200,000 can be used. Examples of the elastomer include a polystyrene-poly(ethylene/propylene) block copolymer (SEP), a styrene-isoprene-styrene block copolymer (SIS), a styrene-butadiene-styrene block copolymer (SBS), a styrene-butadiene-butylene-styrene block copolymer (SBBS), and hydrogenated products thereof, a styrene-ethylene-butylene-styrene block copolymer (SEBS), a styrene-ethylene-propylene-styrene block copolymer (styrene-isoprene-styrene block copolymer) (SEPS), a styrene-ethylene-ethylene-propylene-styrene block copolymer (SEEPS), a styrene-ethylene-ethylene-propylene-styrene block copolymer (SEPTON V9461 (manufactured by KURARAY Co., Ltd.), SEPTON V9475 (manufactured by KURARAY Co., Ltd.)) of which the styrene block is a reaction crosslinking type, a styrene-ethylene-butylene-styrene block copolymer (having a reactive polystyrene-based hard block, SEPTON V9827 (manufactured by KURARAY Co., Ltd.)) of which the styrene block is a reaction crosslinking type, and polystyrene-poly(ethylene-ethylene/propylene)block-polystyrene block copolymer (SEEPS-OH: terminal hydroxyl group denaturation). Elastomers of which the content of the styrene unit and the weight average molecular weight are within the above ranges can be used.

In addition, among the elastomers, a hydrogenated product is more preferable. In the case of the hydrogenated product, stability with respect to heat is improved, and alteration such as decomposition or polymerization is less likely to occur. In addition, the hydrogenated product is more preferable from the viewpoint of the solubility in hydrocarbon-based solvents and the resistance to resist solvents.

In addition, among the elastomers, an elastomer of which both terminals are block polymers of styrene is more preferable. This is because a higher heat resistance is exhibited by blocking styrene having high heat stability at both terminals thereof.

More specifically, the elastomer is more preferably a hydrogenated product of a block copolymer of styrene and conjugated diene. Stability with respect to heat is improved, and alteration such as decomposition or polymerization is less likely to occur. In addition, a higher heat resistance is exhibited by blocking styrene having high heat stability at both terminals thereof. Furthermore, it is more preferable from the viewpoint of the solubility in hydrocarbon-based solvents and the resistance to resist solvents.

Examples of a commercially available product which can be used as the elastomer included in the adhesive constituting the adhesive layer 3 include "SEPTON (product name)" manufactured by KURARAY Co., Ltd., "HYBRAR (product name)" manufactured by KURARAY Co., Ltd., "TUFTEC (product name)" manufactured by Asahi Kasei Corporation, and "DYNARON (product name)" manufactured by JSR Corporation.

The content of the elastomer included in the adhesive constituting the adhesive layer 3, for example, is preferably within a range of 50 parts by weight to 99 parts by weight, more preferably within a range of 60 parts by weight to 99 parts by weight, and most preferably within a range of 70 parts by weight to 95 parts by weight when the total amount of the adhesive composition is set to 100 parts by weight. When the content of the elastomer is within these ranges, it is possible to suitably bond a wafer and a support while maintaining the heat resistance.

In addition, plural types of elastomers may be mixed. In other words, the adhesive constituting the adhesive layer 3 may contain plural types of elastomers. At least one among plural types of elastomers may include the styrene unit as a structural unit of a main chain. In addition, when at least one among plural types of elastomers has the content of the styrene unit which is within a range of 14% by weight to 50% by weight, or the weight average molecular weight which is within a range of 10,000 to 200,000, it is within a range of the present invention. In addition, in a case where plural types of elastomers are contained in the adhesive constituting the adhesive layer 3, the content of the styrene unit may be adjusted so as to be within the above-described range as a result of mixing. For example, when SEPTON 4033 of SEPTON (product name) manufactured by KURARAY Co., Ltd. of which the content of the styrene unit is 30% by weight and SEPTON 2063 of SEPTON (product name) of which the content of the styrene unit is 13% by weight are mixed in a weight ratio of 1:1, the content of styrene with respect to the entire elastomer included in the adhesive becomes 21% by weight to 22% by weight, and thus, becomes 14% by weight or greater. In addition, for example, when an elastomer of which the content of the styrene unit is 10% by weight and an elastomer of which the content of the styrene unit is 60% by weight are mixed in a weight ratio of 1:1, the content of styrene becomes 35% by weight, and thus the content is within the above-described range. The present invention may also be such a form. In addition, it is most preferable that all the plural types of elastomers included in the adhesive constituting the adhesive layer 3 contain the styrene unit within the above-described range, and the weight average molecular weight thereof is within the above-described range.

Moreover, the adhesive layer 3 is preferably formed by using a resin other than a photocurable resin (for example, a UV curable resin). By using a resin other than a photocurable resin, it is possible to prevent residues from remaining around minute unevenness of the supported substrate after stripping or removing the adhesive layer 3. In particular, as the adhesive constituting the adhesive layer 3, an adhesive which is not dissolved in all solvents but dissolved in only a specific solvent is preferable. This is because the adhesive layer 3 is removable by dissolving in the solvent without applying a physical force to the substrate 1. When removing the adhesive layer 3, it is possible to easily remove the adhesive layer 3 without damage or deformation of the substrate 1 even from the substrate 1 of which the strength is reduced.

Polysulfone-Based Resin

The adhesive for forming the adhesive layer 3 may include a polysulfone-based resin. By forming the adhesive layer 3 using a polysulfone-based resin, it is possible to manufacture a laminate in which the support plate can be stripped from the substrate by dissolving the adhesive layer in the following step, even in the case of treating the laminate at a high temperature. In a case where the adhesive layer 3 includes a polysulfone resin, the laminate can be suitably used even in a high temperature process of treating a laminate at a high temperature of 300° C. or higher, for example, by annealing or the like.

The polysulfone-based resin has a structure formed of at least one structural unit selected from among the structural unit represented by the following general formula (3) and the structural unit represented by the following general formula (4).

[Chemical formula 2]

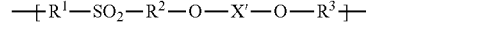

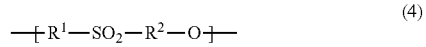

(Here, each of $R^1$, $R^2$, and $R^3$ in General formula (3), and $R^1$ and $R^2$ in General formula (4) is independently selected from the group consisting of a phenylene group, a naphthylene group, and an anthrylene group, and X' is an alkylene group having 1 to 3 carbon atoms.)

When the polysulfone-based resin has at least one of the polysulfone structural unit represented by Formula (3) and the polyether sulfone structural unit represented by Formula (4), it is possible to form a laminate capable of preventing the adhesive layer 3 from being insolubilized by decomposition, polymerization, or the like even in the case of treating the substrate 1 under a high temperature condition after attaching the support plate 2 to the substrate 1. In addition, in a case where the polysulfone-based resin is a polysulfone resin formed of the polysulfone structural unit represented by Formula (3), the polysulfone-based resin is stable even when heated to a higher temperature. Thus, it is possible to prevent occurrence of residues resulting from the adhesive layer on the substrate after washing.

The weight average molecular weight (Mw) of the polysulfone-based resin is preferably within a range of 30,000 to 70,000, and more preferably within a range of 30,000 to 50,000. When the weight average molecular weight (Mw) of the polysulfone-based resin is within a range of 30,000 or greater, it is possible to obtain an adhesive composition which can be used at high temperatures of 300° C. or higher, for example. In addition, when the weight average molecular weight (Mw) of the polysulfone-based resin is within a range of 70,000 or less, the polysulfone-based resin can be suitably dissolved by a solvent. That is, it is possible to obtain an adhesive composition which can be suitably removed by a solvent.

Diluent Solvent

Examples of a diluent solvent used when forming the adhesive layer 3 include linear hydrocarbons such as hexane, heptane, octane, nonane, methyloctane, decane, undecane, dodecane, and tridecane, branched hydrocarbons having 4 to 15 carbon atoms, cyclic hydrocarbons such as cyclohexane, cycloheptane, cyclooctane, naphthalene, decahydronaphthalene, and tetrahydronaphthalene, and terpene solvents such as p-menthane, o-menthane, m-menthane, diphenylmenthane, 1,4-terpin, 1,8-terpin, bornane, norbornane, pinane, thujane, carane, longifolene, geraniol, nerol, linalool, citral, citronellol, menthol, isomenthol, neomenthol, α-terpineol, β-terpineol, γ-terpineol, terpinene-1-ol, terpinene-4-ol, dihydroterpinylacetate, 1,4-cineol, 1,8-cineol, borneol, carvone, ionone, thujone, camphor, d-limonene, l-limonene, and dipentene; lactones such as γ-butyrolactone; ketones such as acetone, methyl ethyl ketone, cyclohexanone (CH), methyl-n-pentyl ketone, methyl isopentyl ketone, and 2-heptanone; polyalcohols such as ethylene glycol, diethylene glycol, propylene glycol, and dipropylene glycol; compounds having an ester bond such as ethylene glycol monoacetate, diethylene glycol monoacetate, propylene glycol monoacetate, and dipropylene glycol monoacetate, and derivatives of polyalcohols such as compounds having an ether bond such as monoalkyl ethers such as monomethyl ether, monoethyl ether, monopropyl ether, and monobutyl ether or monophenyl ethers of the polyalcohols or the compounds having the ester bond (among these, propylene glycol monomethyl ether acetate (PGMEA) and propylene glycol monomethyl ether (PGME) are preferable); cyclic ethers such as dioxane, or esters such as methyl lactate, ethyl lactate (EL), methyl acetate, ethyl acetate, butyl acetate, methoxybutyl acetate, methyl pyruvate, ethyl pyruvate, methyl methoxypropionate, and ethyl ethoxypropionate; and aromatic organic solvents such as anisole, ethylbenzyl ether, cresylmethyl ether, diphenyl ether, dibenzyl ether, phenetole, and butylphenyl ether.

Other Components

The adhesive constituting the adhesive layer 3 may further include another miscible substance in such a range that no essential feature is impaired. For example, various additives commonly used to improve performance of the adhesive such as an additive resin, a plasticizer, an adhesion auxiliary agent, a stabilizer, a colorant, a thermal polymerization inhibitor, and a surfactant can further be used.

Release Agent

In addition, the adhesive force of the adhesive may be adjusted by mixing a release agent. Thus, it is possible to reduce the force needed when separating the support plate 2 from the substrate 1 in the separation step. Accordingly, it is possible to prevent the substrate 1 from being damaged in the separation step, and it is possible to more suitably perform the separation step.

As the release agent, for example, silicones can be mentioned. More specifically, examples of the silicone include a silicone oil, and specifically, include a straight silicone oil, a denatured silicone oil, and a cured product of a denatured silicone oil.

Straight Silicone Oil

Examples of the straight silicone oil include a dimethyl silicone oil, a methyl phenyl silicone oil, and a methyl hydrogen silicone oil.

Denatured Silicone Oil

The denatured silicone oil is silicone denatured by introducing a functional group into at least a part of the terminal and the side chain of dimethyl silicone. That is, the denatured silicone oil corresponds to any one of a both terminals type denatured silicone, a one terminal type denatured silicone, a side chain type denatured silicone, and a side chain both terminals type denatured silicone.

Examples of the functional group which is introduced into a denatured silicone oil include a functional group with which a carbinol group, an epoxy group, an amino group, an acrylic group, a methacrylic group, a carboxyl group, a phenol group, a mercapto group, an alkyl group, an aralkyl group, diol, a silanol group, a polyether, a carboxylic acid anhydride, a higher fatty acid ester, a higher fatty acid amide, or a methylstyryl group can be introduced.

The denatured silicone oil can be suitably selected depending on the type of the thermoplastic resin used in the adhesive composition. For example, in a case where a hydrocarbon resin and an elastomer are used as the thermoplastic resin, a silicone oil denatured by introducing a functional group having high polarity such as a carbinol group, an epoxy group, an amino group, an acrylic group, a methacrylic group, a carboxyl group, a phenol group, a mercapto group, a silanol group, diol, or polyether is more preferably used as a release agent.

A hydrocarbon resin and an elastomer such as a hydrogenated styrene elastomer have chemical structures having low polarity. Therefore, in the case of mixing a denatured silicone oil into which a functional group having high polarity has been introduced, the denatured silicone oil can more suitably ooze to the surface of the adhesive layer 3.

That is, in the case of mixing a denatured silicone oil into which a functional group having high polarity has been introduced, it is possible to suitably adjust the adhesive properties of the adhesive composition having a high heat resistance, including a hydrocarbon resin and an elastomer such as a hydrogenated styrene elastomer.

The kinematic viscosity of a silicone oil such as a straight silicone oil or a denatured silicone oil at 25° C. is preferably 20 $mm^2$/s or greater, more preferably 40 $mm^2$/s or greater, and most preferably 60 m/s or greater. When the kinematic viscosity of the silicone oil at 25° C. is 20 $mm^2$/s or greater, it is possible to prevent the silicone oil from evaporating. Thus, for example, even in the case of a laminate to be treated at a high temperature of 160° C. or higher, it is possible to use the adhesive composition. In addition, the silicone oil is not particularly limited as long as it can be mixed into a thermoplastic resin, and a silicone oil having a kinematic viscosity at 25° C. of 1,000,000 $mm^2$/s or less may be used.

In addition, the mixing amount of the silicone oil with respect to the total amount of the thermoplastic resin may be suitably adjusted depending on the type of the thermoplastic resin and the type of the release agent. Thus, for example, the release agent is preferably mixed within a range of 0.01% by weight to 10% by weight, more preferably mixed in within a range of 0.1% by weight to 5% by weight, and most preferably mixed in within a range of 1% by weight to 3% by weight, with respect to the total amount of the thermoplastic resin, however, the embodiment is not particularly limited thereto. When the silicone oil is mixed in within a range of 0.01% by weight to 10% by weight with respect to the total amount of the thermoplastic resin, it is possible to suitably attach the support plate 2 to the substrate 1. In addition, it is possible to obtain an adhesive composition which can form a laminate in which the support plate 2 can be easily stripped from the substrate 1 even in the case of not forming a release layer on the support plate 2.

Moreover, as the above-described straight silicone oil and denatured silicone oil, for example, products manufactured by Shin-Etsu Chemicals Co., Ltd. can be used.

Cured Product of Denatured Silicone Oil

As the release agent, a cured product of a denatured silicone oil may be used. By adding a cured product of a denatured silicone oil into the adhesive composition, it is also possible to suitably adjust the adhesive properties of the adhesive composition.

As the cured product of a denatured silicone oil, a cured product obtained by reacting a functional group introduced into a denatured silicone oil with a functional group of another denatured silicone oil can be mentioned. For example, a cured product obtained by reacting an amine-denatured silicone oil or a mercapto-denatured silicone oil with an epoxy-denatured silicone oil can be mentioned.

In addition, as the cured product of a denatured silicone oil, for example, a cured product obtained by reacting a catalyst-curing type or light-curing type silicone oil can be mentioned. As the catalyst-curing type silicone oil, for example, KF-705F-PS, KS-705F-PS-1, KS-770-PL-3, and the like manufactured by Shin-Etsu Chemicals Co., Ltd. can be mentioned. In addition, as the light-curing type silicone oil, for example, KS-720 and KS744-PL3 manufactured by Shin-Etsu Chemicals Co., Ltd. can be mentioned.

In addition, regarding the cured product of a denatured silicone oil, for example, after obtaining a cured product by reacting isocyanate with a denatured silicone oil to which a functional group having an active hydrogen such as a carbinol-denatured silicone oil or an amino-denatured silicone oil is introduced, the cured product may be used as the release agent.

Release Layer 4

Next, the release layer 4 is a layer formed of a material which is altered by absorbing light applied through the support plate 2.

A laser for emitting light with which the release layer 4 is irradiated can be suitably selected depending on materials constituting the release layer 4, and a laser that emits light having a wavelength that can alter materials constituting the release layer 4 may be selected.

The release layer 4 is provided on the surface of the side of the support plate 2 where the substrate 1 is bonded through the adhesive layer 3.

For example, the thickness of the release layer 4 is preferably within a range of 0.05 µm to 50 µm, and more preferably within a range of 0.3 µm to 1 µm. When the thickness of the release layer 4 is within a range of 0.05 µm to 50 µm, a desired alteration can be generated at the release layer 4 by irradiation with light for a short period of time and irradiation with light having low energy. In addition, the thickness of the release layer 4 is particularly preferably within a range of 1 µm or less from the viewpoint of productivity.

Moreover, in the laminate 10, other layers may be further formed between the release layer 4 and the support plate 2. In this case, the other layers may be constituted with a material which transmits light. Thus, it is possible to suitably add a layer which imparts preferable properties to the laminate 10 without preventing the incidence of light into the release layer 4. The wavelength of light which can be used is different depending on the type of material constituting the release layer 4. Thus, the material constituting the other layers is not required to transmit all light and can be suitably selected from materials which can transmit light having a wavelength that can alter materials constituting the release layer 4.

In addition, the release layer 4 is preferably formed only of material having a structure which absorbs light, and the release layer 4 may be formed by adding a material not having a structure which absorbs light in such a range where no essential feature of the invention is impaired. In addition, a surface of the side facing the adhesive layer 3 in the release layer 4 is preferably flat (unevenness is not formed). Thus, it is possible to easily perform formation of the release layer 4, and uniform attachment at the time of attachment.

Fluorocarbon

The release layer 4 may be formed of fluorocarbon. By being constituted by the fluorocarbon, the release layer 4 is altered by absorbing light, and as a result, the release layer loses strength or adhesive properties it used to have before being irradiated with light. Therefore, by applying a slight external force (for example, lifting the support plate 2), the release layer 4 is broken, and thus, it is possible to easily separate the support plate 2 from the substrate 1. Fluorocarbon constituting the release layer 4 can be suitably film-formed by a plasma chemical vapor deposition (CVD) method.

The fluorocarbon absorbs light having a wavelength within the specific range depending on the type thereof. By irradiating the release layer with light having a wavelength within the range that fluorocarbon used in the release layer 4 absorbs light, the fluorocarbon can be suitably altered. The absorptivity of light in the release layer 4 is preferably 80% or greater.

As the light with which the release layer 4 is irradiated, laser lights such as solid lasers including a YAG laser, a ruby laser, a glass laser, a $YVO_4$ laser, an LD laser, a fiber laser, and the like, liquid lasers including a dye laser and the like, gas lasers including a $CO_2$ laser, an excimer laser, an Ar laser, a He—Ne laser, and the like, a semiconductor laser, and a free electron laser, or non-laser lights may be suitably used depending on the wavelength which can be absorbed by fluorocarbon. As the wavelength that can alter fluorocarbon, for example, a wavelength within a range of 600 nm or less can be used, but the wavelength is not limited thereto.

Polymer Including Structure Having Light Absorption Properties in Repeating Unit Thereof The release layer 4 may contain a polymer including a structure having light absorption properties in the repeating unit thereof. The polymer is altered by irradiation with light. The alteration of the polymer occurs when the structure absorbs the light which is applied. As a result of the alteration of the polymer, the release layer 4 loses the strength or the adhesive properties it used to have before being irradiated with light. Therefore, by applying a slight external force (for example, lifting the support plate 2), the release layer 4 is broken, and thus, it is possible to easily separate the support plate 2 from the substrate 1.

The structure having light absorption properties is a chemical structure that alters the polymer including the structure as a repeating unit by absorbing light. For example, the structure is an atomic group including a conjugated n-electron system formed of a substituted or unsubstituted benzene ring, a condensed ring, or a heterocycle. In more detail, the structure may be a cardo structure, a benzophenone structure present at the side chain of the polymer, a diphenyl sulfoxide structure, a diphenyl sulfone structure (bisphenyl sulfone structure), a diphenyl structure, or a diphenylamine structure.

In a case where the structure is present at the side chain of the polymer, the structure can be represented by the following formulas.

[Chemical formula 3]

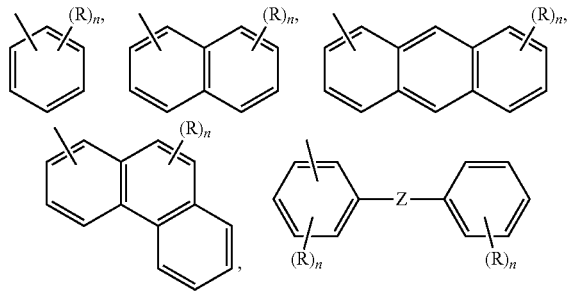

(In the formulas, each of R's independently represents an alkyl group, an aryl group, a halogen, a hydroxyl group, a ketone group, a sulfoxide group, a sulfone group, or $N(R^4)(R^5)$ (here, each of $R^4$ and $R^5$ independently represents a hydrogen atom or an alkyl group having 1 to 5 carbon atoms), Z is absent or represents —CO—, —SO$_2$—, —SO—, or —NH—, and n is an integer of 0 or 1 to 5.)

In addition, for example, the polymer includes a repeating unit represented by any one of (a) to (d), is represented by (e), or includes the structure of (f) in the main chain, among the following formulas.

[Chemical formula 4]

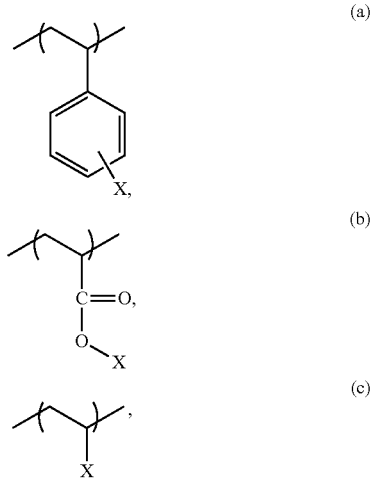

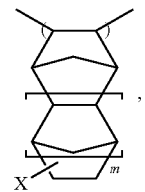

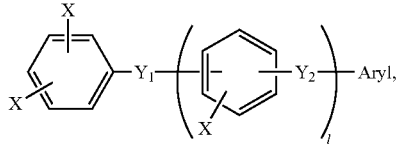

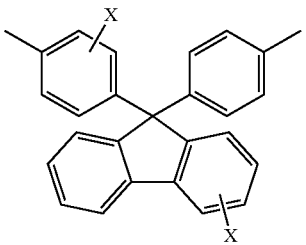

(In the formulas, l is an integer of 1 or greater, m is an integer of 0, 1, or 2, X in (a) to (e) is any one of the formulas shown in "Chemical formula 3", X in (f) is any one of the formulas shown in "Chemical formula 3" or is absent, and each of $Y_1$ and $Y_2$ independently represent —CO— or SO$_2$—. l is preferably an integer of 10 or less.)

Examples of the benzene ring, the condensed ring, and the heterocycle shown in "Chemical formula 3" include phenyl, substituted phenyl, benzyl, substituted benzyl, naphthalene, substituted naphthalene, anthracene, substituted anthracene, anthraquinone, substituted anthraquinone, acridine, substituted acridine, azobenzene, substituted azobenzene, fluorim, substituted fluorim, fluorimon, substituted fluorimon, carbazole, substituted carbazole, N-alkylcarbazole, dibenzofuran, substituted dibenzofuran, phenanthrene, substituted phenanthrene, pyrene, and substituted pyrene. In a case where the exemplified substituent further has a substituent, the substituent, for example, can be selected from alkyl, aryl, a halogen atom, alkoxy, nitro, aldehyde, cyano, amide, dialkylamino, sulfonamide, imide, carboxylic acid, carboxylic ester, sulfonic acid, sulfonic ester, alkylamino, and arylamino.

Among the substituents shown in "Chemical formula 3", examples of the case of the fifth substituent having two phenyl groups and —SO$_2$— as Z include bis(2,4-dihydroxyphenyl)sulfone, bis(3,4-dihydroxyphenyl)sulfone, bis(3,5-dihydroxyphenyl)sulfone, bis(3,6-dihydroxyphenyl)sulfone, bis(4-hydroxyphenyl)sulfone, bis(3-hydroxyphenyl)sulfone, bis(2-hydroxyphenyl)sulfone, and bis(3,5-dimethyl-4-hydroxyphenyl)sulfone.

Among the substituents shown in "Chemical formula 3", examples of the case of the fifth substituent having two phenyl groups and —SO— as Z include bis(2,3-dihydroxyphenyl)sulfoxide, bis(5-chloro-2,3-dihydroxyphenyl)sulfoxide, bis(2,4-dihydroxyphenyl)sulfoxide, bis(2,4-dihydroxy-6-methylphenyl)sulfoxide, bis(5-chloro-2,4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxy-6-methylphenyl)sulfoxide, bis(5-chloro-2,3,4-trihydroxyphenyl)sulfoxide, bis(2,4,6-trihydroxyphenyl)sulfoxide, and bis(5-chloro-2,4,6-trihydroxyphenyl)sulfoxide.

Among the substituents shown in "Chemical formula 3", examples of the case of the fifth substituent having two phenyl groups and —C(=O)— as Z include 2,4-dihydroxybenzophenone, 2,3,4-trihydroxybenzophenone, 2,2',4,4'-tetrahydroxybenzophenone, 2,2',5,6'-tetrahydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-amino-2'-hydroxybenzophenone, 4-dimethylamino-2'-hydroxybenzophenone, 4-diethylamino-2'-hydroxybenzophenone, 4-dimethylamino-4'-methoxy-2'-hydroxybenzophenone, 4-dimethylamino-2',4'-dihydroxybenzophenone, and 4-dimethylamino-3',4'-dihydroxybenzophenone.

In a case where the structure is present at the side chain of the polymer, the proportion occupied by the repeating unit including the structure in the polymer is within a range in which the light transmittance of the release layer 4 becomes 0.001% to 10%. When a polymer is prepared such that the proportion is within the range, the release layer 4 sufficiently absorbs light, and thus, the polymer can be reliably and quickly altered. That is, it is easy to remove the support plate 2 from the laminate 10, and it is possible to reduce a light irradiation time needed for the removal.

The above structure can absorb light having a wavelength within the desired range by selection of the type thereof. For example, the wavelength of light that can be absorbed by the structure is more preferably within a range of 100 nm to 2,000 nm. Within the range, the wavelength of light that can be absorbed by the structure is a shorter wavelength side, and for example, the wavelength is within a range of 100 nm to 500 nm. For example, preferably, by absorbing ultraviolet light having a wavelength within a range of about 300 nm to 370 nm, the structure can alter a polymer including the structure.

Examples of the light that can be absorbed by the structure include lights emitted from a high-pressure mercury lamp (wavelength: 254 nm to 436 nm), a KrF excimer laser (wavelength: 248 nm), an ArF excimer laser (wavelength: 193 nm), an $F_2$ excimer laser (wavelength: 157 nm), a XeCl laser (wavelength: 308 nm), a XeF laser (wavelength: 351 nm), or a solid-state UV laser (wavelength: 355 nm), a g-line (wavelength: 436 nm), an K-line (wavelength: 405 nm), and an i-line (wavelength: 365 nm).

The above-described release layer 4 contains a polymer including the structure as a repeating unit, and the release layer 4 can further include a component other than the polymer. Examples of the component include a filler, a plasticizer, and a component that can improve the stripping properties of the support plate 2. These components are suitably selected from substances or materials known in the related art which do not inhibit absorption of light by the structure and alteration of the polymer, or promote the absorption of light by the structure and the alteration of the polymer.

Inorganic Substance

The release layer 4 may be formed of an inorganic substance. By being constituted with an inorganic substance, the release layer 4 is altered by absorbing light, and as a result, the release layer 4 loses the strength or the adhesive properties it used to have before being irradiated with light. Therefore, by applying a slight external force (for example, lifting the support plate 2), the release layer 4 is broken, and thus, it is possible to easily separate the support plate 2 from the substrate 1.

The inorganic substance may have a constitution which is altered by absorbing light. For example, one or more inorganic substances selected from the group consisting of a metal, a metal compound, and carbon can be suitably used. The metal compound refers to a compound including a metal atom, and for example, the metal compound can be a metal oxide or a metal nitride. Examples of the inorganic substance include one or more inorganic substances selected from the group consisting of gold, silver, copper, iron, nickel, aluminum, titanium, chromium, $SiO_2$, SiN, $Si_3N_4$, TiN, and carbon, but the inorganic substance is not limited thereto. Moreover, the carbon can also include an allotrope of carbon, and examples of the allotrope of carbon can include diamond, fullerene, diamond-like carbon, and a carbon nanotube.

The inorganic substance absorbs light having a wavelength within the specific range depending on the type thereof. By irradiating the release layer with light having a wavelength within the range that the inorganic substance used in the release layer 4 absorbs light, the inorganic substance can be suitably altered.

As the light with which the release layer 4 formed of an inorganic substance is irradiated, laser lights such as solid lasers including a YAG laser, a ruby laser, a glass laser, a $YVO_4$ laser, an LD laser, a fiber laser, and the like, liquid lasers including a dye laser and the like, gas lasers including a $CO_2$ laser, an excimer laser, an Ar laser, a He—Ne laser, and the like, a semiconductor laser, and a free electron laser, or non-laser lights may be suitably used depending on the wavelength which can be absorbed by the inorganic substance.

The release layer 4 formed of an inorganic substance can be formed on the support plate 2, for example, by a known technique such as sputtering, chemical vapor deposition (CVD), plating, plasma CVD, or spin coating. The thickness of the release layer 4 formed of an inorganic substance is not particularly limited, and the thickness may be a film thickness that can sufficiently absorb the light to be used. For example, a film thickness within a range of 0.05 μm to 10 μm is more preferable. In addition, after both sides or one side of an inorganic film (for example, a metal film) formed of an inorganic substance constituting the release layer 4 is coated with an adhesive in advance, the inorganic film may be attached to the support plate 2 and the substrate 1.

Moreover, in a case where the metal film is used as the release layer 4, reflection of the laser or charging to the film may occur depending on the conditions such as the film quality of the release layer 4, the type of the laser light source, the laser output, and the like. For this reason, it is preferable to take countermeasures for the problem by providing an antireflection film or an antistatic film on upper and under sides or on any one side of the release layer 4.

Compound Having Infrared Ray Absorbing Structure

The release layer 4 may be formed of a compound having an infrared ray absorbing structure. The compound is altered by absorbing the infrared rays. As a result of alteration of the compound, the release layer 4 loses the strength and the adhesive properties it used to have before being irradiated with infrared rays. Therefore, by applying a slight external force (for example, lifting the support), the release layer 4 is broken, and thus, it is possible to easily separate the support plate 2 from the substrate 1.

Examples of a structure having infrared ray absorption properties and a compound including a structure having infrared ray absorption properties can include alkane, alkene (vinyl, trans, cis, vinylidene, trisubstituted, tetrasubstituted, conjugated, cumulene, or cyclic), alkyne (monosubstituted or disubstituted), a monocyclic aromatic compound (benzene, monosubstituted, disubstituted, or trisubstituted), alcohols and phenols (free OH, an intramolecular hydrogen bond, an intermolecular hydrogen bond, saturated secondary, saturated tertiary, unsaturated secondary, or unsaturated tertiary), acetal, ketal, aliphatic ether, aromatic ether, vinyl ether, oxirane ring ether, ether peroxide, ketone, dialkyl carbonyl, aromatic carbonyl, enol of 1,3-diketone, o-hydroxy aryl ketone, dialkyl aldehyde, aromatic aldehyde, carboxylic acid (dimer or carboxylate anion), formic ester, acetic ester, conjugated ester, non-conjugated ester, aromatic ester, lactone (β-, γ-, or δ-), aliphatic acid chloride, aromatic acid chloride, acid anhydride (conjugated, non-conjugated, cyclic, or acyclic), primary amide, secondary amide, lactam, primary amine (aliphatic or aromatic), secondary amine (aliphatic or aromatic), tertiary amine (aliphatic or aromatic), a primary amine salt, a secondary amine salt, a tertiary amine salt, ammonium ion, aliphatic nitrile, aromatic nitrile, carbodiimide, aliphatic isonitrile, aromatic isonitrile, isocyanic ester, thiocyanic ester, aliphatic isothiocyanic ester, aromatic isothiocyanic ester, an aliphatic nitro compound, an aromatic nitro compound, nitroamine, nitrosoamine, nitric ester, nitrite ester, a nitroso bond (aliphatic, aromatic, monomer, or dimer), sulfur compounds such as mercaptan, thiophenol, and thiol acid, a thiocarbonyl group, sulfoxide, sulfone, sulfonyl chloride, primary sulfonamide, secondary sulfonamide, sulfuric ester, a carbon-halogen bond, a Si-$A^1$ bond ($A^1$ is H, C, O, or a halogen), a P-$A^2$ bond ($A^2$ is H, C, or O), and a Ti—O bond.

Examples of the structure including the carbon-halogen bond include —$CH_2Cl$, —$CH_2Br$, —$CH_2I$, —$CF_2$-, —$CF_3$, —$CH=CF_2$, —$CF=CF_2$, aryl fluoride, and aryl chloride.

Examples of the structure including the Si-$A^1$ bond include SiH, $SiH_2$, $SiH_3$, Si—$CH_3$, Si—$CH_2$—, Si—$C_6H_5$, SiO-aliphatic group, Si—$OCH_3$, Si—$OCH_2CH_3$, Si—$OC_6H_5$, Si—O—Si, Si—OH, SiF, $SiF_2$, and $SiF_3$. As the structure including the Si-$A^1$ bond, in particular, a structure in which a siloxane skeleton or a silsesquioxane skeleton is formed is preferable.

Examples of the structure including the P-$A^2$ bond include PH, $PH_2$, P—$CH_3$, P—$CH_2$—, P—$C_6H_5$, $A^3{}_3$-P—O ($A^3$ is an aliphatic group or an aromatic group), $(A^4O)_3$-P—O ($A^4$ is an alkyl group), P—$OCH_3$, P—$OCH_2CH_3$, P—$OC_6H_5$, P—O—P, P—OH, and O=P—OH.

The above-described structures can absorb infrared rays having a wavelength within the desired range by selection of the type thereof. Specifically, for example, the wavelength of infrared rays that can be absorbed by the structure is within a range of 1 μm to 20 μm, and the structure can more suitably absorb a wavelength within a range of 2 μm to 15 μm. Furthermore, in a case where the above-described structure is a Si—O bond, a Si—C bond, or a Ti—O bond, the wavelength may be within the range of 9 μm to 11 μm. Moreover, those skilled in the art can easily understand the wavelength of infrared rays that can be absorbed by each structure. For example, as an absorption band in each structure, description in pp. 146 to 151 of non-patent literature: "Spectrometric identification of organic compounds—combined use of MS, IR, NMR, UV—(5th edition)", written by Silverstein, Bassler and Morrill (published in 1992) can be referred to.

The compound having an infrared ray absorbing structure, used in the formation of the release layer 4, is not particularly limited as long as the compound has the structure described above, can be dissolved in a solvent to be applied, and can form a solid layer by being solidified. However, in order to easily separate the support plate 2 from the substrate 1 by effectively altering the compound in the release layer 4, it is preferable that the absorption of infrared rays in the release layer 4 is great, that is, the transmittance of infrared rays when the release layer 4 is irradiated with the infrared rays is low. Specifically, the transmittance of infrared rays in the release layer 4 is preferably less than 90%, and the transmittance of infrared rays is more preferably less than 80%.

For example, as the compound having a siloxane skeleton, a resin which is a copolymer having a repeating unit represented by the following Chemical formula (5) and a repeating unit represented by the following Chemical formula (6), or a resin which is a copolymer having a repeating unit represented by the following Chemical formula (5) and a repeating unit derived from an acryl-based compound can be used.

[Chemical formula 5]

(5)

(6)

(In Chemical formula (6), $R^6$ represents hydrogen, an alkyl group having 10 or less carbon atoms, or an alkoxy group having 10 or less carbon atoms.)

Among these, as the compound having a siloxane skeleton, a tert-butylstyrene (TBST)-dimethylsiloxane copolymer which is a copolymer having the repeating unit represented by Chemical formula (5) and the repeating unit represented by Chemical formula (7) is more preferable, and a TBST-dimethylsiloxane copolymer which includes the repeating unit represented by Chemical formula (5) and the repeating unit represented by Chemical formula (7) at a ratio of 1:1 is still more preferable.

[Chemical formula 6]

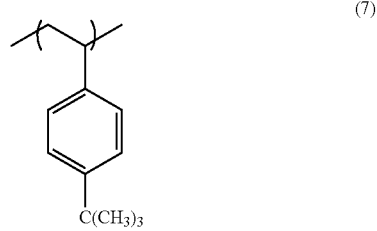

(7)

In addition, as the compound having a silsesquioxane skeleton, for example, a resin which is a copolymer having the repeating unit represented by Chemical formula (8) and the repeating unit represented by Chemical formula (9) can be used.

[Chemical formula 7]

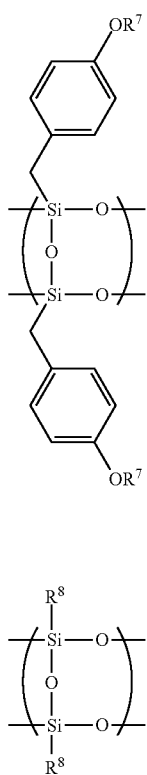

(8)

(9)

(In Formula (8), $R^7$ represents hydrogen or an alkyl group having 1 to 10 carbon atoms, and in Formula (9), $R^8$ represents an alkyl group having 1 to 10 carbon atoms or a phenyl group.)

In addition to the above compounds, as the compound having the silsesquioxane skeleton, each silsesquioxane resin disclosed in Japanese Unexamined Patent Application, Publication No. 2007-258663 (published in Oct. 4, 2007), Japanese Unexamined Patent Application, Publication No. 2010-120901 (published in Jun. 3, 2010), Japanese Unexamined Patent Application, Publication No. 2009-263316 (published in Nov. 12, 2009), or Japanese Unexamined Patent Application, Publication No. 2009-263596 (published in Nov. 12, 2009) can be suitably used.

Among these, as the compound having the silsesquioxane skeleton, a copolymer having the repeating unit represented by the following Chemical formula (10) and the repeating unit represented by the following Chemical formula (11) is more preferable, and a copolymer which includes the repeating unit represented by the following Chemical formula (10) and the repeating unit represented by the following Chemical formula (11) at a ratio of 7:3 is still more preferable.

[Chemical formula 8]

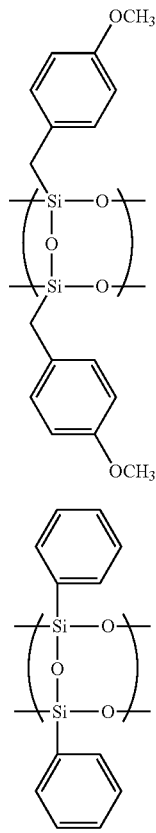

(10)

(11)

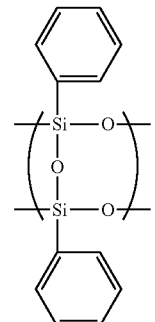

Although the polymer having the silsesquioxane skeleton can have a random structure, a ladder structure, or a basket structure, the polymer may have any structure.

In addition, examples of the compound including a Ti—O bond include (i) alkoxy titaniums such as tetra-i-propoxy titanium, tetra-n-butoxy titanium, tetrakis(2-ethylhexyloxy) titanium, and titanium-i-propoxy octylene glycolate; (ii) chelate titaniums such as di-i-propoxy bis(acetylacetonato) titanium and propanedioxy titanium bis(ethyl acetoacetate); (iii) titanium polymers such as i-$C_3H_7O$—[—Ti(O-i-$C_3H_7$)$_2$—O-]$_n$-i-$C_3H_7$ and n-$C_4H_9O$—[—Ti(O-n-$C_4H_9$)$_2$—O-]$_n$-n-$C_4H_9$; (iv) titanium acylates such as tri-n-butoxy titanium monostearate, titanium stearate, di-i-propoxy titanium diisostearate, and (2-n-butoxycarbonyl benzoyloxy) tributoxy titanium; and (v) water-soluble titanium compounds such as di-n-butoxy bis(triethanolaminato)titanium.

Among these, as the compound including a Ti—O bond, di-n-butoxy-bis(triethanolaminato)titanium (Ti(OC$_4$H$_9$)$_2$[OC$_2$H$_4$N(C$_2$H$_4$OH)$_2$]$_2$) is preferable.

The release layer 4 described above includes a compound having infrared ray absorbing structure, and the release layer 4 can further contain a component other than the above-described compounds. Examples of the component include a filler, a plasticizer, and a component that can improve the stripping properties of the support plate 2. These components are suitably selected from substances or materials known in the related art which do not inhibit absorption of infrared rays by the structure and alteration of compounds, or promote the absorption of infrared rays by the structure and the alteration of compounds.

Infrared Ray Absorbing Substance

The release layer 4 may contain an infrared ray absorbing substance. By being constituted so as to contain the infrared ray absorbing substance, the release layer 4 is altered by absorbing light, and as a result, the release layer loses the strength or the adhesive properties it used to have before being irradiated with light. Therefore, by applying a slight external force (for example, lifting the support plate 2), the release layer 4 is broken, and thus, it is possible to easily separate the support plate 2 from the substrate 1.

The infrared ray absorbing substance may have a constitution which is altered by absorbing infrared rays. For example, carbon black, iron particles, or aluminum particles can be suitably used. The infrared ray absorbing substance absorbs light having a wavelength within the specific range depending on the type thereof. By irradiating the release layer 4 with light having a wavelength within the range that the infrared ray absorbing substance used in the release layer 4 absorbs, the infrared ray absorbing substance can be suitably altered.

Laminate According to One Modified Example

The laminate used in the supporting member separation method according to the present invention is not limited to the laminate 10 used in the above-described embodiment.

Figure 2B:
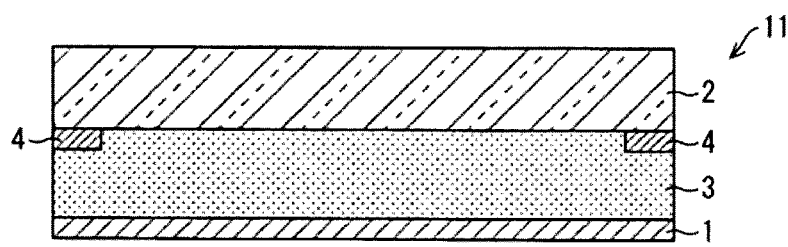

As shown in FIG. 2B, for example, in the supporting member separation method according to one embodiment, a laminate 11 according to one modified example, having a support in which a release layer is provided on the entire perimeter of the peripheral portion on the surface of the side facing the substrate 1, may be separated.

Moreover, the same reference numerals are given to the same members as in the laminate 10 shown in FIG. 2A, and only the difference from the laminate 10 will be described.

As shown in FIG. 2B, in the laminate 11, the inside of the peripheral portion of the support plate 2 is in contact with the adhesive layer 3 without the release layer 4, unlike the laminate 10. However, in the laminate 11, the release layer 4 is formed on the entire perimeter of the peripheral portion of the support plate 2 in the same manner as the laminate 10.

According to the above constitution, even in the case of using the laminate 11, in the preliminary treatment step, it is possible to alter the release layer 4 which is formed on the entire perimeter of the peripheral portion of the support plate 2, and due to this, it is possible to reduce the adhesive force. Accordingly, also in the laminate 11, when performing the separation step, it is possible to concentrate a force on the interface between the support plate 2 and the adhesive layer 3, and it is possible to separate the support plate 2 from the substrate 1 without applying an excessive force to the substrate 1 and the support plate 2. That is, it is possible to suitably perform the supporting member separation method according to the present invention.

Moreover, in the laminate 11, the release layer 4 may be provided within a range of 3 mm or less, is more preferably provided within a range of 2 mm or less, and is still more preferably provided within a range of 1.5 mm or less, toward the inside from the end portion of the peripheral portion of the support plate 2.

Laminate According to Other Modified Examples

The laminate used in the supporting member separation method according to one embodiment is not limited to the above-described embodiment and modified example. For example, in the supporting member separation method according to one embodiment, the laminate according to one modified example having the support plate 2 in which the release layer 4 is provided on a part of the peripheral portion thereof may be separated.

According to the above constitution, in the preliminary treatment step, it is possible to alter the release layer 4 which is formed on a part of the peripheral portion of the support plate 2, and due to this, it is possible to reduce the adhesive force. Accordingly, in the following separation step, it is possible to concentrate a force on the interface between the support plate 2 and the adhesive layer 3.

Both the laminate used in the first embodiment and the laminate according to each modified example are formed by laminating the substrate 1, the adhesive layer 3, and the support plate 2 in which the release layer 4 is provided on at least a part of the peripheral portion on the surface of the side facing the substrate 1, in this order. That is, when the release layer 4 is provided on at least a part of the peripheral portion of the support plate 2 of the laminate, it is possible to reduce the adhesive force of the release layer 4 by the preliminary treatment step. Thus, for example, it is not necessary to separate the support from the substrate by inserting a blade or the like into the adhesive layer, and it is possible to prevent the substrate from being damaged due to insertion of a blade or the like.

In addition, the laminate used in the supporting member separation method according to one embodiment is not limited to the above-described embodiment and modified example. In the supporting member separation method according to one embodiment, for example, a laminate including a release agent in the adhesive layer may be used as the laminate according to another modified example. Here, examples of the release agent include those listed in the above-described "Release Agent".

For example, it is possible to more suitably adjust the adhesive properties at both the interface between the adhesive layer 3 and the substrate 1 and the interface between the adhesive layer 3 and the release layer 4 by including a release agent in the adhesive layer 3 of the laminate 10 shown in FIG. 2A. In addition, for example, it is possible to more suitably adjust the adhesive properties at both the interface between the adhesive layer 3 and the substrate 1 and the interface between the adhesive layer 3 and the support plate 2 by including a release agent in the adhesive layer 3 of the laminate 11 shown in FIG. 2B. Accordingly, when separating the support plate 2 from the substrate 1 by the supporting member separation method according to one embodiment, it is possible to reduce the force needed in order to separate the support plate 2 from the substrate 1.

Second Embodiment

Figure 3A:
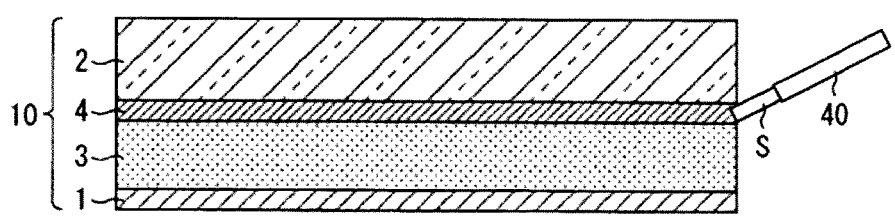
FIG. 3A is a diagram illustrating an outline of a preliminary treatment step included in the supporting member separation method according to one embodiment of the present invention.

The supporting member separation method according to the present invention is not limited to the above-described embodiment. As shown in FIG. 3A, for example, as a second embodiment, in the preliminary treatment step, the release layer 4 is dissolved by a dissolving solution S, and due to this, the adhesive force may be reduced.

In the supporting member separation method according to the embodiment, in the preliminary treatment step, the laminate 10 is fixed on the mounting table such as a spin chuck and rotated, and a dissolving solution may be supplied to the outer peripheral portion of the laminate 10. Thus, it is possible to suitably reduce the adhesive force of the release layer 4 which is provided on the entire perimeter of the peripheral portion of the support plate 2 of the laminate 10.

According to the above constitution, it is possible to suitably reduce the adhesive force of the release layer which is provided on the peripheral portion of the support plate 2, similarly to the supporting member separation method according to the first embodiment. Accordingly, in the separation step, it is possible to concentrate a force applied to the laminate 10 on the release layer 4, and thus, it is possible to suitably separate the support plate 2 from the substrate 1.

As the dissolving solution, a dissolving solution which suitably dissolves the release layer 4 and is less likely to dissolve the adhesive layer 3 is more preferably used. Thus, in particular, it is possible to dissolve the release layer 4, and in the following separation step, it is possible to concentrate a force on the release layer 4 which has been dissolved and in which the adhesive force of the peripheral portion has been reduced.

Moreover, after the release layer 4 which is provided on at least a part of the entire perimeter of the peripheral portion on the support plate 2 is removed by a dissolving solution, the laminate 10 may be washed with water or alcohol having 1 to 6 carbon atoms. Thus, it is possible to prevent the dissolving solution (which includes amines, for example) remaining on the laminate 10 from corroding the substrate 1.

Dissolving Solution

The dissolving solution is a solution for dissolving the release layer 4 which is provided on the peripheral portion of the support plate 2. The dissolving solution may be suitably selected according to the type of the release layer 4 and the type of the adhesive layer 3.

The dissolving solution is more preferably a solution having alkalinity. The solution having alkalinity is still more preferably an amine-based compound. As the amine-based compound, it is possible to use at least one compound selected from the group consisting of primary, secondary, or tertiary aliphatic amines, alicyclic amines, aromatic amines, or heterocyclic amines.

Examples of the primary aliphatic amines include monomethanolamine, monoethanolamine (MEA), monoisopropanolamine, ethylenediamine, 2-(2-aminoethoxyl)ethanol (DGA), and 2-(2-aminoethylamino)ethanol. Examples of the secondary aliphatic amines include 2-(methylamino)ethanol (MMA), diethanolamine, iminobispropylamine, and 2-ethylaminoethanol. Examples of the tertiary aliphatic amines include triethanolamine, triisopropanolamine, and diethylaminoethanol.

In addition, examples of the alicyclic amines include cyclohexylamine and dicyclohexylamine. Examples of the aromatic amines include benzylamine, dibenzylamine, and N-methylbenzyl amine. Examples of the heterocyclic amines include N-hydroxyethyl piperidine and 1,8-diazabicyclo[5,4,0]-7-undecene. Among compounds of these organic amines, in particular, alkanolamines such as monoethanolamine, 2-(2-aminoethoxyl)ethanol, 2-ethylaminoethanol, and 2-(methylamino)ethanol (MMA) are preferable.

In addition, examples of the solvent which can be used as the dissolving solution include polar solvents such as N-methyl-2-pyrrolidone (NMP) and dimethyl sulfoxide (DMSO), lactones such as γ-butyrolactone, ketones such as acetone, methyl ethyl ketone, cyclohexanone, methyl-n-pentyl ketone, methyl isopentyl ketone, and 2-heptanone, polyalcohols such as ethylene glycol, diethylene glycol, propylene glycol, and dipropylene glycol, and organic solvents of compounds having an ester bond such as ethylene glycol monoacetate, diethylene glycol monoacetate, propylene glycol monoacetate, and dipropylene glycol monoacetate, and further includes derivatives of polyalcohols such as compounds having an ether bond such as monoalkyl ether such as monobutyl ether, monoethyl ether, monopropyl ether, and monobutyl ether or monophenyl ether of the above polyalcohols or the above compounds having an ester bond, cyclic ethers such as dioxane, organic solvents of esters such as methyl lactate, ethyl lactate (EL), methyl acetate, ethyl acetate, butyl acetate, methyl pyruvate, ethyl pyruvate, methyl methoxypropionate, and ethyl ethoxypropionate, and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene.

In addition, as a solvent which can be used as the dissolving solution described above, among these, at least one selected from polar solvents, polyalcohols, compounds having an ester bond, or derivatives of polyalcohols is preferable, and at least one selected from dimethyl sulfoxide (DMSO), diethylene glycol monomethyl ether, triethylene glycol dimethyl ether, diethylene glycol diethyl ether, ethylene glycol monobutyl ether, propylene glycol monopropyl ether, diethylene glycol methyl ethyl ether, dipropylene glycol monomethyl ether, ethylene glycol monoisopropyl ether, ethylene glycol monoisobutyl ether, diethylene glycol dimethyl ether, propylene glycol monoethyl ether, propylene glycol monomethyl ether (PGME), butylene diglycol, propylene glycol monomethyl ether acetate (PGMEA), or propylene glycol monoethyl ether acetate is more preferable.

Furthermore, as the dissolving solution used in the preliminary treatment step, the solution having alkalinity described above and a solvent which can be used as the dissolving solution can be used in mixture. For example, as a solvent mixed with an amine-based compound, a solvent which suitably dissolves the release layer 4 and is less likely to dissolve the adhesive layer 3 may be selected.

The mixing ratio between the solution having alkalinity and the solvent which can be used as the dissolving solution is preferably is 9:1 to 1:9, and more preferably 8:2 to 2:8 in a weight ratio.

In addition, in the preliminary treatment step, the dissolving solution may be supplied to the outer peripheral portion of the laminate 10 by immersing the laminate 10 in a dissolution tank in which the dissolving solution is stored. Moreover, in the case of performing the preliminary treatment step by immersing in the dissolving solution, the immersion time of the laminate 10 may be suitably adjusted according to the concentration, the composition, or the supply method of the dissolving solution.

Third Embodiment

Figure 3B:
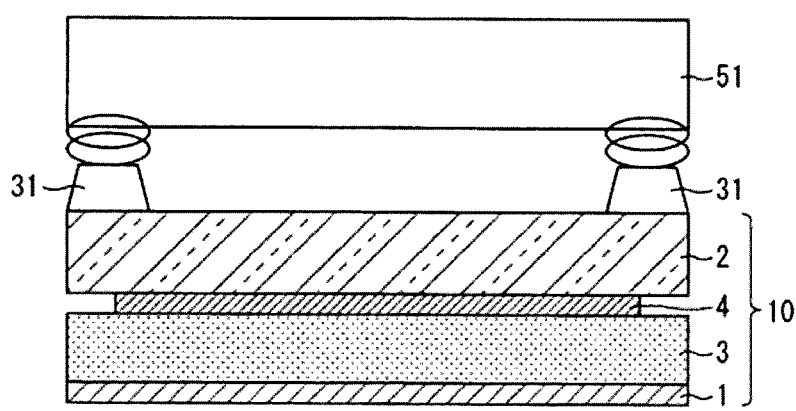
FIG. 3B is a diagram illustrating an outline of a separation step included in the supporting member separation method according to one embodiment.

The supporting member separation method according to the present invention is not limited to the first embodiment and the second embodiment. As shown in FIG. 3B, in a separation step included in a supporting member separation method according to a third embodiment, for example, a force may be applied to the laminate 10 by holding the peripheral portion of the upper surface of the support plate 2 of the laminate 10 by the holding means such as a bellows pad 31, and elevating a release plate 51. Accordingly, in the same manner as in the case using the release plate 50 having the clamp 30, it is possible to suitably separate the support plate 2 from the substrate 1.

The bellows pad 31 can suck the support plate 2 of the laminate 10 by the decompression means or the like, and thus, it is possible to hold the support plate 2.

Here, as the decompression means, which is not particularly limited, a vacuum pump may be used as in the case of a porous portion of the mounting table. Thus, it is possible to more strongly hold the support plate 2 by the bellows pad 31.

In addition, three to twenty bellows pads 31 are preferably provided at an equal interval on the peripheral portion of the surface of the release plate 51 facing the laminate 10. Thus, in the same manner as in the first embodiment, in the separation step, it is possible to apply a force to the laminate 10 without detaching the laminate 10.

Fourth Embodiment

The supporting member separation method according to the present invention is not limited to the above-described embodiment. For example, a supporting member separation method according to one embodiment (Fourth embodiment) is a supporting member separation method for separating a laminate having a substrate formed of silicon and a release layer which is altered by absorbing light, and in a preliminary treatment step, the release layer is altered by irradiation with light having a wavelength of 9 μm to 11 μm through the substrate formed of silicon, and due to this, the adhesive force is reduced.

As shown in (a) to (e) of FIG. 4, in the supporting member separation method according to the embodiment, the support plate 2 is separated from a laminate 12 manufactured by performing an adhesive layer forming step of forming the adhesive layer 3 on the substrate 1 ((a) and (b) of FIG. 4), a release layer forming step of forming a release layer 4a on the support plate 2 ((c) and (d) of FIG. 4), and a lamination step of laminating the substrate 1 and the support plate 2 through the adhesive layer 3 and the release layer 4a ((e) of FIG. 4).

In addition, the supporting member separation method according to the embodiment includes a preliminary treatment step of altering the entire perimeter of the peripheral portion of the release layer 4a by irradiation with light L from the substrate 1 side of the laminate 12 toward the end portion of the peripheral portion of the release layer 4a ((f) of FIG. 4) and a separation step of separating the support plate 2 from the substrate 1 by fixing the substrate 1 side of the laminate 12 and by applying a force to the support plate 2 side ((g) to (i) of FIG. 4).

Laminate 12

The substrate 1 of the laminate 12 shown in (e) of FIG. 4 is subjected to a thinning treatment so as to have a predetermined thickness, as an example, by a grinding means such as a grinder. In addition, the laminate 12 can form, for example, a through electrode or the like through a photolithography step or the like in a Through Silicone Via (TSV) process. Since the laminate 12 has the release layer 4a having a high chemical resistance which is formed by polymerizing the reactive polysilsesquioxane, it is possible to suitably prevent the release layer 4a from being damaged by various chemicals used in the TSV process. In addition, even when the laminate 12 is subjected to a high temperature treatment, it is possible to prevent voids from occurring between the adhesive layer 3 and the support plate 2 due to alteration of the release layer 4a.

Hereinafter, the laminate 12 used in the supporting member separation method according to the embodiment will be described in more detail with reference to (a) to (e) of FIG. 4. As shown in (e) of FIG. 4, the laminate 12 is formed by laminating the substrate 1 formed of silicon, the adhesive layer 3, the release layer 4a formed by polymerizing the reactive polysilsesquioxane due to heating, and the support plate 2, in this order. Moreover, as the support plate 2 of the laminate 12, the same support plate as that in the first embodiment can be used, and thus, the description thereof will not be repeated.

In the laminate 12, a silicon wafer shown in (a) of FIG. 4 is used as the substrate 1. Thus, by irradiating the release layer 4a with infrared rays from the substrate 1 side of the laminate 12, it is possible to alter the release layer 4a.

In addition, in the laminate 12, the adhesive layer may be formed of the same adhesive as that in the adhesive layer 3 of the laminate 10.

The adhesive layer 3 is used for attaching the support plate 2 to the substrate 1. The adhesive layer 3 can be formed by coating with an adhesive by a method such as a spin coating method, a dipping method, a roller blade method, a spray coating method, or a slit coating method, for example. In addition, for example, instead of directly coating the substrate 1 with an adhesive, the adhesive layer 3 may be formed by attaching a film (so-called dry film) of which both surfaces have been coated with an adhesive in advance to the substrate 1 (adhesive layer forming step, (b) of FIG. 4).

The thickness of the adhesive layer 3 may be suitably set depending on the type of the substrate 1 and the support plate 2 to be attached and a treatment to be performed on the substrate 1 after attachment. The thickness of the adhesive layer 3 is preferably within a range of 10 μm to 150 μm, and more preferably within a range of 15 μm to 100 μm.

Release Layer 4a

The release layer 4a is formed by coating the support plate 2 shown in (c) of FIG. 4 with a solution in which the reactive polysilsesquioxane has been dissolved in a solvent, then, by polymerizing the reactive polysilsesquioxane due to heating the support plate 2 coated with the solution (release layer forming step, (d) of FIG. 4).

Examples of the method for coating the support plate 2 with the solution of the reactive polysilsesquioxane include a spin coating method, a dipping method, a roller blade method, a spray coating method, and a slit coating method. In addition, the concentration of the reactive polysilsesquioxane in the solution may be suitably adjusted depending on the coating method of a solution, and may be within a range of 1% by weight to 50% by weight. Moreover, the solution of the reactive polysilsesquioxane may be prepared using diluent solvents listed in the above-described "Diluent Solvent". Here, as the diluent solvent, derivatives of polyalcohols are preferable. Examples of the derivatives of polyalcohols include propylene glycol monomethyl ether acetate (PGMEA) and propylene glycol monomethyl ether (PGME), and PGMEA or PGME is preferable, and PGMEA is more preferable.

By heating the reactive polysilsesquioxane with which the support plate 2 was coated, the reactive polysilsesquioxane on the support plate 2 is polymerized. Thus, the polysilsesquioxane molecules forming the release layer 4a are cross-linked with each other, and thus, it is possible to improve the chemical resistance and the heat resistance of the release layer 4a.

The temperature for heating the reactive polysilsesquioxane is preferably 100° C. to 500° C., and more preferably 200° C. to 400° C. When the reactive polysilsesquioxane is heated at a temperature of 100° C. to 500° C., it is possible to suitably polymerize the reactive polysilsesquioxane, and it is possible to improve the heat resistance and the chemical resistance of the release layer 4a.

In addition, the heating time of the reactive polysilsesquioxane is preferably 5 minutes to 120 minutes, and more preferably 30 minutes to 120 minutes. When the heating time of the reactive polysilsesquioxane is 5 minutes to 120 minutes, it is possible to sufficiently remove the solvent from the release layer 4a by evaporation due to heat while suitably reacting the reactive polysilsesquioxane. In addition, it is possible to suitably remove water which is a byproduct produced when polymerizing the reactive polysilsesquioxane. Accordingly, it is possible to prevent voids from occurring between the support plate 2 and the release layer 4a due to the solvent, water, or the like remaining in the release layer 4a after forming the laminate 10.

For example, the thickness of the release layer 4a is preferably 0.05 µm to 50 µm, and more preferably 0.3 µm to 2 µm. When the thickness of the release layer 4a is within a range of 0.05 µm to 50 µm, it is possible to treat the release layer 4a without trouble in the heating step and when performing stripping. In addition, the thickness of the release layer 4a is particularly preferably within a range of 2 µm or less from the viewpoint of productivity.

Reactive Polysilsesquioxane

The release layer 4a can be formed by polymerizing the reactive polysilsesquioxane, and thus, the release layer 4a has a high chemical resistance and a high heat resistance.

In the present specification, the reactive polysilsesquioxane is polysilsesquioxane having a silanol group or a functional group capable of forming a silanol group by hydrolysis at the terminal of a polysilsesquioxane skeleton, and by condensing the silanol group or the functional group capable of forming a silanol group, polysilsesquioxane can be polymerized with each other. In addition, when the reactive polysilsesquioxane has the silanol group or the functional group capable of forming a silanol group, it is possible to employ a reactive polysilsesquioxane having the silsesquioxane skeleton such a random structure, a basket structure, or a ladder structure.

In addition, the reactive polysilsesquioxane more preferably has the structure represented by the following formula (12).

[Chemical formula 9]

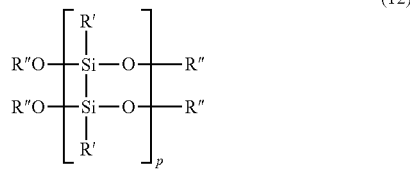

(12)

In Formula (12), each R″ is independently selected from the group consisting of hydrogen and an alkyl group having 1 to 10 carbon atoms, and more preferably selected from the group consisting of hydrogen and an alkyl group having 1 to 5 carbon atoms. When R″ is hydrogen or an alkyl group having 1 to 10 carbon atoms, it is possible to suitably condense the reactive polysilsesquioxane represented by Formula (12) by heating in the release layer forming step.

In Formula (12), p is preferably an integer of 1 to 100, and more preferably an integer of 1 to 50. Since the reactive polysilsesquioxane has the repeating unit represented by Formula (12), the reactive polysilsesquioxane has a higher content of the Si—O bond than that formed by using other materials, and it is possible to form the release layer 4a having high absorbance in infrared rays (0.78 µm to 1,000 µm), preferably in far infrared rays (3 µm to 1,000 µm), and more preferably in light having a wavelength of 9 µm to 11 µm.

In addition, in Formula (12), R′ each independently represent organic groups which are the same as or different from each other. Here, R, for example, is an aryl group, an alkyl group, or an alkenyl group, and these organic groups may have a substituent.

In a case where R′ is an aryl group, examples of the aryl group include a phenyl group, a naphthyl group, an anthryl group, and a phenanthryl group, and a phenyl group is more preferable. In addition, the aryl group may be bonded to a polysilsesquioxane skeleton through an alkylene group having 1 to 5 carbon atoms.

In a case where R′ is an alkyl group, examples of the alkyl group include a linear alkyl group, a branched alkyl group, and a cyclic alkyl group. In a case where R′ is an alkyl group, an alkyl group having 1 to 15 carbon atoms is preferable, and an alkyl group having 1 to 6 carbon atoms is more preferable. In addition, in a case where R′ is a cyclic alkyl group, the cyclic alkyl group may be an alkyl group having a monocyclic or bi- to tetracyclic structure.

When R′ is an alkenyl group, examples of the alkenyl group can include a linear alkenyl group, a branched alkenyl group, and a cyclic alkenyl group similar to the case of the alkyl group, and the alkenyl group preferably has 2 to 15 carbon atoms, and more preferably has 2 to 6 carbon atoms. In addition, in a case where R′ is a cyclic alkenyl group, the cyclic alkenyl group may be an alkenyl group having a monocyclic or bi- to tetracyclic structure. Examples of the alkenyl group can include a vinyl group and an allyl group.

In addition, examples of the substituent which is included in R′ can include a hydroxyl group and an alkoxy group. In a case where the substituent is an alkoxy group, examples of the alkoxy group can include a linear alkylalkoxy group, a branched alkylalkoxy group, and a cyclic alkylalkoxy group, and the alkoxy group preferably has 1 to 15 carbon atoms, and more preferably has 1 to 10 carbon atoms.

In addition, in one aspect, the siloxane content of the reactive polysilsesquioxane is preferably 70 mol % to 99 mol %, and more preferably 80 mol % to 99 mol %. When the siloxane content of the reactive polysilsesquioxane is 70 mol % to 99 mol %, it is possible to form the release layer which can be suitably altered by irradiation with infrared rays (preferably, far infrared rays, and more preferably light having a wavelength of 9 µm to 11 µm).

In addition, in one aspect, the weight average molecular weight (Mw) of the reactive polysilsesquioxane is preferably 500 to 50,000, and more preferably 1,000 to 10,000. When the weight average molecular weight (Mw) of the reactive polysilsesquioxane is 500 to 50,000, it is possible to suitably dissolve the reactive polysilsesquioxane in a solvent, and it is possible to suitably coat the support with the reactive polysilsesquioxane.

Examples of commercially available products that can be used as the reactive polysilsesquioxane can include SR-13, SR-21, SR-23, and SR-33 manufactured by KONISHI CHEMICAL IND. CO., Ltd.

Preliminary Treatment Step

As shown in (f) of FIG. 4, in the preliminary treatment step, the light L is applied toward the release layer 4a from the peripheral portion of the substrate 1 of the laminate 12. That is, the light is applied toward the release layer 4a through a portion at which an element is not mounted on the substrate 1 formed of silicon of the laminate 12. Thus, it is possible to prevent the element (not shown) mounted on the substrate 1 from being damaged by irradiation with infrared rays. In addition, thus, as shown in a region a in (g) of FIG. 4, it is possible to reduce the adhesive force of the release layer 4a of the laminate 12.

As the mounting table for setting the laminate 12, the same mounting table as that in the first embodiment can be used, and thus, the description thereof will not be repeated. In addition, in the preliminary treatment step according to the embodiment, the laminate 12 may be set on a mounting table such as a stage or a spin chuck such that the support plate 2 side of the laminate 12 is positioned on the bottom surface side, without attaching a dicing tape equipped with a dicing frame on the surface of the substrate 1 side of the laminate 12. This is because, in the supporting member separation method according to the embodiment, the light is applied toward the release layer 4a from the substrate 1 side of the laminate 12.

Irradiation with Light

Typical examples of the laser for emitting light with which the release layer 4a is irradiated include infrared rays (0.78 μm to 1,000 μm), preferably far infrared rays (3 μm to 1,000 μm), and more preferably light having a wavelength of 9 μm to 11 μm. Specifically, the laser is a $CO_2$ laser. The $CO_2$ laser can be transmitted through the substrate 1 formed of silicon, and can be absorbed in the release layer 4a which is a polymer of the reactive polysilsesquioxane. Thus, by irradiation with the light L from the surface of the substrate 1 side of the laminate 12, it is possible to alter the release layer 4a, and it is possible to make the release layer 4a brittle with respect to an external force.

As the conditions of laser light irradiation in the preliminary treatment step, the average output value of the laser light is preferably 1.0 W to 50.0 W, and more preferably 3.0 W to 40.0 W. The repetition frequency of the laser light is preferably 20 kHz to 60 kHz, and more preferably 30 kHz to 50 kHz. The scanning speed of the laser light is preferably 100 mm/s to 10,000 mm/s, and more preferably 100 mm/s to 1,000 mm/s. Thus, it is possible to set the laser irradiation conditions to the suitable conditions for altering the release layer 4a. In addition, the beam spot diameter of continuous light and the irradiation pitch of continuous light may be a pitch which is not overlapped with an adjacent beam spot and is capable of altering the release layer 4a.

In addition, in the preliminary separation step included in the supporting member separation method according to the embodiment, it is preferable to reduce the adhesive force of the release layer 4a present within a range of 7 mm or less, and more preferable to reduce the adhesive force of the release layer 4 present within a range of 5 mm or less, toward the inside from the end portion of the peripheral portion of the support plate 2. Thus, when separating the support plate 2 from the substrate 1, it is possible to concentrate a force on the release layer 4a in which the adhesive force was reduced.

Separation Step

The separation step can be performed by using the same supporting member separation apparatus as that in the first embodiment. As shown in (g) of FIG. 4, in the separation step, the laminate 12 is fixed such that the substrate 1 side of the laminate 12 faces down. Here, a dicing tape is attached to the surface of the substrate 1 side of the laminate 12 after performing the preliminary treatment step, and then, the separation step may be performed. Thus, it is possible to successfully perform a dicing step or the like of the substrate 1 performed after the separation step while preventing the substrate 1 subjected to a thinning treatment from being damaged.

In the separation step, as shown in (h) of FIG. 4, the end portion of the peripheral portion of the support plate 2 of the laminate 12 is gripped by the release plate 50 having plural clamps 30, and by lifting the support plate 2, the support plate 2 is separated from the substrate 1. In the laminate 12, as shown in (g) of FIG. 4, the adhesive force of the release layer 4a in the region a is reduced. Therefore, as shown in (h) of FIG. 4, the beveled portion of the end portion of the peripheral portion of the support plate 2 is gripped, and by applying a force to the support plate 2, it is possible to concentrate the force on the region a. Accordingly, by applying an external force, it is possible to separate the support plate 2 from the substrate 1 ((i) of FIG. 4).

According to the supporting member separation method of the embodiment, it is possible to suitably separate the support plate 2 from the laminate 12 after performing various treatments on the substrate 1 using the laminate having the release layer 4a having a high heat resistance and a high chemical resistance.

Fifth Embodiment

The supporting member separation method according to the present invention is not limited to the above-described embodiment. For example, the supporting member separation method according to one embodiment (Fifth embodiment) is a supporting member separation method for separating a laminate having a support formed of silicon and a release layer which is altered by absorbing light, and in a preliminary treatment step, the release layer is altered by irradiation with light having a wavelength within a range of 9 μm to 11 μm through the support formed of silicon, and due to this, the adhesive force is reduced.

As shown in (a) to (e) of FIG. 5, in the supporting member separation method according to the embodiment, a support plate 2a is separated from a laminate 13 manufactured by performing an adhesive layer forming step of forming the adhesive layer 3 on the substrate 1 ((a) and (b) of FIG. 5), a release layer forming step of forming the release layer 4a on the support plate 2a formed of silicon ((c) and (d) of FIG. 5), and a lamination step of laminating the substrate 1 and the support plate 2a through the adhesive layer 3 and the release layer 4a ((e) of FIG. 5).

In addition, the supporting member separation method according to the embodiment includes a preliminary treatment step of altering the peripheral portion of the release layer 4a by irradiation with the light L from the support plate 2a side of the laminate 13 toward the entire perimeter of the peripheral portion of the release layer 4a ((f) of FIG. 5) and a separation step of separating the support plate 2a from the substrate 1 by fixing the substrate 1 side of the laminate 13 and by applying a force to the support plate 2a side ((g) to (i) of FIG. 5).

Moreover, the adhesive layer forming step in (a) and (b) of FIG. 5 is the same as that in the fourth embodiment, and thus, the description thereof will not be repeated. In addition, in the release layer forming step, the release layer 4a is formed on the silicon support plate (support) 2a shown in (c) of FIG. 5 by polymerizing the reactive polysilsesquioxane due to heating ((d) of FIG. 5). The release layer 4a of the laminate 13 can be manufactured by the same method as that in the fourth embodiment except for being formed on the silicon support plate 2a.

Laminate 13

As shown in (e) of FIG. 5, the laminate 13 is formed by laminating the substrate 1, the adhesive layer 3, the release layer 4a formed by polymerizing the reactive polysilsesquioxane due to heating, and the support plate 2a, in this order. Here, as the substrate 1, a substrate formed of silicon is used. Since, in the laminate 13, the substrate 1 formed of silicon is supported by the support plate 2a formed of silicon, thermal expansion coefficients of the substrate 1 and the support plate 2a can become substantially equal. Therefore, for example, in the laminate 13, when heating in a TSV process, a high temperature process, or the like, it is possible to reduce distortion due to the difference in coefficients of thermal expansion between the substrate 1 and the support plate 2a. Accordingly, it is possible to perform various processes on the substrate 1 with a high accuracy.

Preliminary Treatment Step

As shown in (f) of FIG. 5, in the preliminary treatment step, the release layer 4a of the laminate 13 is irradiated with the light L from the entire perimeter of the peripheral portion of the support plate 2a formed of silicon. Therefore, it is possible to prevent the element mounted inside the entire perimeter of the peripheral portion of the substrate 1 of the laminate 13 from being damaged by the light with which the release layer 4a is irradiated through the support plate 2a. In addition, thus, as shown in a region a in (g) of FIG. 5, it is possible to reduce the adhesive force of the release layer 4a of the laminate 13.

As the mounting table for setting the laminate 13, the same mounting table as that in the first embodiment can be used, and thus, the description thereof will not be repeated. In addition, in the preliminary treatment step according to the embodiment, after a dicing tape equipped with a dicing frame is attached to the surface of the substrate 1 side of the laminate 13, the laminate 13 may be set on a mounting table such as a stage or a spin chuck such that the substrate 1 side of the laminate 13 is positioned on the bottom surface side. Thus, it is possible to successfully perform a step performed after the preliminary treatment step while preventing the substrate 1 subjected to a thinning treatment from being damaged.

In the preliminary treatment step included in the supporting member separation method according to the embodiment, in the same manner as in the case of the fourth embodiment, the laminate 13 having the release layer 4a formed by polymerizing the reactive polysilsesquioxane due to heating is used. Accordingly, it is possible to perform the preliminary treatment step under the same conditions of light irradiation as the conditions of light irradiation of the release layer 4a in the fourth embodiment except that the light is applied toward the release layer 4a through the support plate 2a formed of silicon of the laminate 13.

Separation Step

The separation step can be performed by using the same supporting member separation apparatus as that in the first embodiment. In the separation step, the laminate 13 is fixed such that the substrate 1 side of the laminate 13 faces down ((g) of FIG. 5).

Thereafter, as shown in (h) of FIG. 5, the end portion of the peripheral portion of the support plate 2a of the laminate 13 is gripped by the release plate 50 having the plural clamps 30, and by lifting the support plate 2, the support plate 2a is separated from the substrate 1. In the laminate 13, as shown in (g) of FIG. 5, the adhesive force of the release layer 4a in the region a is reduced. Therefore, as shown in (h) of FIG. 5, the beveled portion of the end portion of the peripheral portion of the support plate 2a is gripped, and by applying a force to the support plate 2, it is possible to concentrate the force on the region a. Accordingly, by applying an external force, it is possible to separate the support plate 2a from the substrate 1 ((i) of FIG. 5).

According to the supporting member separation method of the embodiment, it is possible to suitably separate the support plate 2a from the laminate 13 after performing various treatments on the substrate 1 using the laminate 13 which includes the release layer 4a having a high heat resistance and a high chemical resistance and is capable of suppressing distortion of the substrate 1 due to the difference in coefficients of thermal expansion between the substrate 1 and the support plate 2a.

Supporting Member Separation Method According to Another Embodiment

The supporting member separation method according to the present invention is not limited to the first to fifth embodiments.

In the supporting member separation method according to one embodiment, in the preliminary treatment step, as the range in which the adhesive force of the release layer 4 is reduced, the adhesive force of at least only a part of the release layer 4 provided on the peripheral portion of the support plate 2 may be reduced. In any of the laminate and the laminate according to each modified example, the release layer 4 is provided on at least a part of the peripheral portion of the support plate 2. In a case where at least a part of the release layer 4 is altered in the preliminary treatment step, and due to this, the adhesive force is reduced, in the following separation step, it is possible to concentrate a force on the portion at which the adhesive force of the release layer 4 was reduced. Accordingly, it is possible to suitably separate the support plate 2 from the substrate 1.

In addition, in the supporting member separation method according to another embodiment, after the preliminary treatment step, the support plate 2 may be separated from the substrate 1 by applying a force to the substrate 1 after fixing a part of the support plate 2. Thus, it is possible to suitably separate the support plate 2 from the substrate 1.

In addition, in the supporting member separation method according to another embodiment, the release layer included in the laminate used in the fourth embodiment and the fifth embodiment is not limited to the release layer formed by polymerizing the reactive polysilsesquioxane. For example, the release layer is not limited as long as it can be altered by absorbing light transmitted through the substrate formed of silicon or the support formed of silicon.

In addition, the laminate used in the supporting member separation method according to another embodiment is a laminate formed by laminating the substrate and the support plate which supports the substrate through the adhesive layer, and the release layer is provided on at least a part of the peripheral portion on the surface of the side of the substrate facing the support plate. As an example, the release layer may be provided on the entire surface of the side of the substrate facing the support plate.

According to the above constitution, in the preliminary treatment step, it is possible to reduce the adhesive force of the release layer provided on at least a part of the peripheral portion on the surface of the side of the substrate facing the support plate. Thus, in the separation step, it is possible to suitably separate the support plate from the laminate subjected to the preliminary treatment step.

In the supporting member separation method according to the present invention, it is possible to suitably select an embodiment of the preliminary treatment step depending on the type of the substrate, the support plate, and the release layer used to form a laminate.

The present invention is not limited to each embodiment described above, and may be variously altered within the scope of the claims. That is, an embodiment derived from a suitable combination of technical means disclosed in different embodiments with the above description is included in the technical scope of the present invention.

Examples

Evaluation of Separability of Support

A preliminary treatment step and a separation step were performed on the laminates of Examples 1 to 3, and the separability of the support was evaluated. The laminates of Examples 1 to 3 are as shown in the following Table 1.

TABLE 1

|  |  | Example 1 | Example 2 | Example 3 |
|---|---|---|---|---|
| Laminate | Support | Glass support | Glass support | Silicon support |
|  | Release layer | Fluorocarbon film | Fluorocarbon film | Fluorocarbon film |
|  | Adhesive layer | A4017 | A4017 | A4017 |
|  | Substrate | Semiconductor wafer substrate | Semiconductor wafer substrate | Semiconductor wafer substrate |
| Preliminary treatment step |  | First embodiment | Second embodiment | Second embodiment |

(Manufacturing of Laminate)

A semiconductor wafer substrate (12 inches, silicon) was spin-coated with TZNR (registered trademark)-A4017 (manufactured by Tokyo Ohka Kogyo Co., Ltd.), and the resultant product was baked at the temperatures of 90° C., 160° C., and 220° C., respectively, for 4 minutes, whereby an adhesive layer was formed (thickness of 50 μm). Then, while rotating the semiconductor wafer substrate on which the adhesive layer had been formed at 1,500 rpm, by supplying TZNR (registered trademark)-HC thinner (manufactured by Tokyo Ohka Kogyo Co., Ltd.) at a supply rate of 10 cc/min with an EBR nozzle for 5 minutes to 15 minutes, the adhesive layer was removed from the peripheral portion of the adhesive layer formed on the semiconductor wafer substrate to 1.3 mm toward the inside on the basis of the end portion of the semiconductor wafer substrate.

Next, a bare glass support (12 inches, thickness of 700 μm) was used as a support, and a release layer was formed on the support by a plasma CVD method using fluorocarbon. The release layer formation was performed under the conditions of a flow rate of 400 sccm, a pressure of 700 mTorr, high-frequency power of 3,000 W, and a film forming temperature of 240° C., and $C_4F_8$ was used as a reaction gas. A fluorocarbon film (thickness of 0.5 μm) which was a release layer was formed on the support by a CVD method.

Next, a silicon support (12 inches, thickness of 700 μm) was used as a support, and under the same conditions as in the case of using the bare glass support, a fluorocarbon film (thickness of 0.5 μm) was formed on the silicon support by the plasma CVD method.

Next, the semiconductor wafer substrate, the adhesive layer, the release layer, and the glass support were overlapped in this order, then, the resultant product was preheated at 215° C. for 180 seconds in vacuum, and the glass support was attached to the semiconductor wafer substrate by being pressed for 360 seconds at an attaching pressure of 2,000 kgf. Thus, laminates of Examples 1 and were produced. In addition, the semiconductor wafer substrate, the adhesive layer, the release layer, and the silicon support were overlapped in this order, and the silicon support was attached to the semiconductor wafer substrate under the same attaching conditions as those in Example 1. Thus, a laminate of Example 3 was produced.

Next, a thinning (50 μm) treatment was performed on the back surface of the semiconductor wafer substrate of each of laminates of Examples 1 to 3 using a back grinding apparatus manufactured by DISCO Corporation.

Preliminary Treatment Step (First Embodiment)

The preliminary treatment step was performed on the laminate of Example 1 by irradiating the release layer with light through the glass support.

As the conditions of laser light irradiation in the preliminary treatment step, the wavelength was 532 nm and the repetition frequency was 40 kHz. In addition, the laser light was applied within a range of 2 mm toward the inside from the end portion of the peripheral portion of the support on the entire perimeter of the peripheral end portion of the support.

Preliminary Treatment Step (Second Embodiment)

The preliminary treatment step was performed by immersing the laminates of Examples 2 and 3 in dimethylsulfoxide (DMSO) being a dissolving solution at room temperature for 36 hours.

Separation Step

The semiconductor wafer substrate side of the laminate subjected to the preliminary treatment step of Example 1 was set on a mounting table, and was fixed by sucking using a vacuum pump. Next, the beveled portion of the end portion of the peripheral portion of the support was gripped by a clamp of the release plate, the release plate was lifted at a speed of 0.1 mm/s, then, a force was applied to the laminate, and due to this, the semiconductor wafer substrate was separated from the support. Under the same conditions, the separation step was also performed on the laminates of Examples 2 and 3.

Evaluation

First, the separation states of the laminates of Examples 1 to 3 subjected to the separation step were evaluated. In any of the laminates of Examples 1 to 3, the support was separated from the wafer substrate at the interface between the release layer and the support.

Next, after the evaluation of the separation state, the semiconductor wafer substrates and the supports of the laminates of Examples 1 to 3 were washed, and the presence or absence of damage in the wafer substrate and the support was visually evaluated. In the wafer substrates and the supports of the laminates of Examples 1 to 3, damage due to application of a force was not observed.

Then, for the glass substrate separated from the laminate of Example 1, the presence or absence of laser spots at the glass separation interface was evaluated using a microscope. As a result, it was confirmed that the laser spots were not observed at a portion located inside the range subjected to the laser irradiation at the glass separation interface, and, in the supporting member separation method according to one embodiment, it was possible to reduce damage risk to the inner peripheral portion of the wafer substrate by laser light.

Evaluation of Separability of Support

In Example 4, a laminate in which a silicon support (12 inches, thickness of 700 μm) was used as a support and a release layer was formed of the reactive polysilsesquioxane was produced, and in Example 5, a laminate in which a glass support was used as a support and a release layer was formed of the reactive polysilsesquioxane was produced. The adhesiveness, the chemical resistance, the heat resistance, and the separability after thinning the semiconductor wafer substrate of each of the laminates were evaluated using the laminate of Example 4, the laminate of Example 5, and the laminate of Example 6 produced under the same conditions as in Example 1.

Production of Laminate

First, a solution was prepared to form a release layer of Example 4. In Example 4, SR-21 (manufactured by KONISHI CHEMICAL IND. CO., Ltd.) was used as the reactive polysilsesquioxane, and SR-21 was dissolved in PGMEA which is a solvent so as to be 20% by weight.

Moreover, SR-21 is a reactive polysilsesquioxane in which the functional group R'— in the following formula (12) is a phenyl group, and the terminal group R"O— is HO—.

[Chemical formula 10]

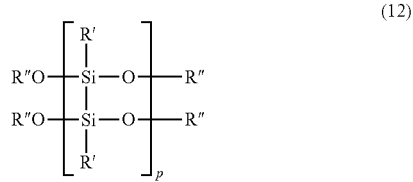

(12)

Subsequently, a 12-inch silicon support was coated with a SR-21 solution by a spin coating method under the condition of 1,500 rpm, and the silicon support was heated at 90° C., 160° C., and 220° C., respectively, for 2 minutes, whereby a release layer of Example 1 having a thickness of 1 μm was formed.

Subsequently, a semiconductor wafer substrate (12 inches, silicon) was spin-coated with TZNR (registered trademark)-A4017 (manufactured by Tokyo Ohka Kogyo Co., Ltd.) in the same procedure as in Examples 1 to 3, whereby an adhesive layer was formed.

Subsequently, the semiconductor wafer substrate, the adhesive layer, the release layer, and the silicon support were overlapped in this order, and a pressure force with a force of 4,000 kg was applied thereto at 215° C. for 2 minutes under the vacuum condition, whereby the laminate of Example 4 was produced.

Moreover, the laminate of Example 5 was produced according to the same procedure as in Example 4 except for using a glass support (12 inches) as a support plate.

Evaluation of Adhesiveness

The semiconductor wafer substrate of each of the laminates of Examples 4 to 6 was thinned until the thickness thereof became 50 μm using a back grinding apparatus manufactured by DISCO Corporation. Then, evaluation of the adhesiveness was visually performed. The evaluation of the adhesiveness was visually performed, and, at the outer peripheral end portion of each laminate, a case where the support plate was not stripped from the semiconductor wafer substrate was evaluated as "B", and a case where the support plate was stripped from the semiconductor wafer substrate was evaluated as "C". The evaluation results are as shown in the following Table 2.

Evaluation of Chemical Resistance

Evaluation of the chemical resistance was performed on the laminates of Examples 4 to 6 subjected to the evaluation of the adhesiveness by immersing them in N-methyl-2-pyrrolidone (NMP) at 60° C. for 10 minutes.

In the evaluation of the chemical resistance, after immersing each laminate in NMP, whether or not the release layer had swelled was visually determined, and, at the outer peripheral end portion of each laminate, a case where the release layer did not swell was evaluated as "A", a case where the release layer swelled, but, the support plate was not stripped from the semiconductor wafer substrate at the outer peripheral end portion of the laminate was evaluated as "B", and a case where the support plate was stripped from the semiconductor wafer substrate by swelling of the release layer was evaluated as "C". The evaluation results are as shown in the following Table 2.

Evaluation of Heat Resistance

Next, evaluation of the heat resistance was performed on the laminates of Examples 4 to 6 subjected to the evaluation of the chemical resistance. Evaluation of the heat resistance was performed under the condition (condition 1) of heating at 220° C. for 10 minutes under the vacuum condition and the condition (condition 2) of heating the laminate subjected to the evaluation of the heat resistance under the condition 1 at 260° C. for 60 minutes under atmospheric pressure.

The evaluation of the heat resistance was performed by visually observing the laminate, and, at the outer peripheral end portion of each laminate, a case where the support plate was not stripped from the semiconductor wafer substrate was evaluated as "B", and a case where the support was stripped from the semiconductor wafer substrate was evaluated as "C". The evaluation results are as shown in the following Table 2.

Separability Evaluation of Support (Fourth Embodiment and Fifth Embodiment)

The preliminary treatment step and the separation step were performed on the laminates of Examples 4 and 5 subjected to evaluations of the adhesiveness, the chemical resistance, and the heat resistance, and evaluation of the separability of the support was performed.

The evaluation of the separability was visually performed, and a case where the semiconductor wafer substrate after the support was separated therefrom was not damaged was evaluated as "B", and a case where the semiconductor wafer substrate was damaged was evaluated as "C".

Preliminary Treatment Step

The preliminary treatment step was performed on the laminate of Example 4 by applying light toward the release layer from the semiconductor wafer substrate side.

In the preliminary treatment step, laser light was applied within a range of 5 mm toward the inside from the end portion of the peripheral portion of the semiconductor wafer substrate (First embodiment). The laser light was applied under the conditions of a wavelength of 9.3 μm, an output of 20 W (100%), and a scanning speed of 500 mm/s using a $CO_2$ laser marker ML-Z9520-T (manufactured by Keyence Corporation).

The preliminary treatment step was performed on the laminate of Example 5 by applying light toward the release layer from the semiconductor wafer substrate side. Moreover, the conditions of laser light irradiation in the preliminary treatment step are the same as those in Example 4.

Separation Step

For the laminates of Examples 4 and 5 subjected to the preliminary treatment step, under the same conditions as in the laminates of Examples 1 to 3, the semiconductor wafer substrate side of each laminate was fixed on a mounting table, and evaluation of the separability was performed by applying a force to the support side.

TABLE 2

|  |  | Example 4 | Example 5 | Example 6 |
|---|---|---|---|---|
| Laminate | Support | Silicon support | Glass support | Glass support |
|  | Release layer | SR-21 | SR-21 | Fluorocarbon film |
|  | Adhesive layer | A4017 | A4017 | A4017 |
|  | Substrate | Semiconductor wafer substrate | Semiconductor wafer substrate | Semiconductor wafer substrate |
| Embodiment |  | Fourth embodiment | Fifth embodiment | First embodiment |
| Adhesive properties |  | B | B | B |
| Chemical resistance |  | A | A | B |
| Heat resistance | Condition 1 | B | B | B |
|  | Condition 2 | B | B | B |
| Separability |  | B | B | *B |

*Based on the evaluation results of Example 1 produced under the same conditions as in Example 6.

Evaluation

As shown in Table 2, in the evaluation of the adhesiveness, in the laminates of Examples 4 to 6, stripping was not observed at the outer peripheral end portion of the laminate (B). In addition, in the laminates of Examples 5 and 6, it was visually observed from the glass support side of the laminate that voids did not occur between the semiconductor wafer substrate and the support.

As shown in Table 2, in the evaluation of the chemical resistance, in the laminate of Example 6, slight swelling of the release layer was observed at the outer peripheral end portion of the laminate but stripping of the glass support from the semiconductor wafer substrate was not observed (B). In contrast, in the laminates of Examples 4 and 5 in which SR-21 was used as a release layer, swelling of the release layer was not observed even when immersed in NMP. From this, in the laminates of Examples 4 and 5, it was found that the laminate formed of the reactive polysilsesquioxan had a higher chemical resistance than the laminate of Example 6.

As shown in Table 2, in the evaluation of the heat resistance, in the laminates of Examples 4 to 6, occurrence of voids was not observed between the semiconductor wafer substrate and the support plate at the end portion of the outer peripheral portion of the laminate (B). In addition, in the same manner as in the case of the evaluation of the adhesiveness, in the laminates of Examples 5 and 6, it was visually observed from the glass support side of the laminate that voids did not occur between the semiconductor wafer substrate and the support.

In the evaluation of the separability, in the laminates of Examples 4 and 5, the support was separated from the semiconductor wafer substrate at the interface between the release layer and the support in the same manner as in the laminates of Examples 1 to 3 using a fluorocarbon film as a release layer.

In addition, as shown in Table 2, in the evaluation of the separability, in the laminates of Examples 4 and 5, damage was not observed in the semiconductor wafer substrate after the support was separated therefrom (B). Then, for the glass supports separated from the laminates of Examples 4 and 5, the presence or absence of laser spots at the support separation interface was evaluated using a microscope. As a result, laser spots were not observed at a portion located inside the range subjected to laser irradiation at the support separation interface.

From the above results, it could be confirmed that, in the laminate in which the release layer was formed of the reactive polysilsesquioxane, it was possible to suitably separate the glass support from the wafer substrate by performing the preliminary treatment step by applying a $CO_2$ laser toward the peripheral portion of the release layer from the semiconductor wafer substrate side of the laminate, and then, by performing the separation step. In addition, it could be confirmed that, in the laminate having the silicon support and the release layer formed of the reactive polysilsesquioxane, it was possible to suitably separate the silicon support from the semiconductor wafer substrate by performing the preliminary treatment step by applying a $CO_2$ laser light toward the peripheral portion of the release layer from the silicon support side, and then, by performing the separation step.

Evaluation of Separation Conditions

In Examples 7 and 8, the preliminary treatment step was performed on laminates produced in the same conditions as those in Example 5, by changing the scanning speed of a $CO_2$ laser, and then, the separability of the glass support from the wafer substrate was evaluated.

In the preliminary treatment step, a laminate irradiated with a $CO_2$ laser at a scanning speed of 2,000 mm/s within a range of 5 mm toward the inside from the end portion of the peripheral portion of the release layer from the semiconductor wafer substrate side was used as the laminate of Example 7, and a laminate irradiated with a $CO_2$ laser at a scanning speed of 6,000 mm/s was used as the laminate of Example 8. Moreover, the conditions of laser irradiation except for the scanning speed of a $CO_2$ laser were the same as those in Example 5. In the evaluation of the separability, the laminate in which the glass support could be separated from the semiconductor wafer substrate by performing the separation step was evaluated as "B", and the laminate in which the glass support could not be separated from the semiconductor wafer substrate was evaluated as "C". The evaluation results are shown in the following Table 3.

TABLE 3

| | Scanning speed of laser (mm/s) | Separability |
|---|---|---|
| Example 5 | 500 | B |
| Example 7 | 2000 | B |
| Example 8 | 6000 | B |

As shown in Table 3, it could be confirmed that it was possible to suitably separate the glass support from the semiconductor wafer substrate under the condition of the scanning speed of the $CO_2$ laser of 500 mm/s (B). In addition, even in the laminates of Examples 7 and 8, it was possible to separate the glass support from the semiconductor wafer substrate in the separation step (B).

The supporting member separation method according to the present invention can be suitably used, for example, in a manufacturing step of a fine semiconductor device.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A supporting member separation method for separating a laminate which is formed by laminating a substrate and a support which supports the substrate through an adhesive layer and in which a release layer is provided on the entire surface of the side of the substrate facing the support or on the entire surface of the side of the support facing the substrate, the method comprising:
    reducing the adhesive force of only an entire perimeter of the peripheral portion of the release layer which is provided on the substrate or the support or reducing the adhesive force of only a part of the peripheral portion; and
    fixing a part of the substrate and the support and separating the support from the substrate by applying a force to another part.

2. The supporting member separation method according to claim 1 for separating a laminate which is formed by laminating the substrate, the adhesive layer, and the support in which a release layer is provided on the entire surface of the side facing the substrate, in this order, the method comprising:
    reducing the adhesive force of only an entire perimeter of the peripheral portion of the release layer which is provided on the support or reducing the adhesive force of only a part of the peripheral portion; and
    fixing a part of the substrate and the support and separating the support from the substrate by applying a force to another part.

3. The supporting member separation method according to claim 1 for separating a laminate having a support formed of a material that transmits light and a release layer which is altered by absorbing light,
    wherein the adhesive force is reduced by altering the release layer by irradiation with light through the support.

4. The supporting member separation method according to claim 1,
    wherein the adhesive force is reduced by dissolving the release layer with a dissolving solution.

5. The supporting member separation method according to claim 1,
    wherein the adhesive force of the release layer present within a range of 0.5 mm or greater toward the inside from the end portion of the peripheral portion of the support is reduced.

6. The supporting member separation method according to claim 1 for separating a laminate in which the end portion of the peripheral portion of the substrate or the support is beveled,
    wherein in the separation, a force is applied by gripping the beveled portion of the end portion of the peripheral portion of the substrate or the support by a claw portion.

7. The supporting member separation method according to claim 1,
    wherein a laminate having a support in which a release layer is provided on the entire surface of the side facing the substrate is separated.

8. The supporting member separation method according to claim 1 for separating a laminate having a support in which a release layer is provided on the entire perimeter or a part of the peripheral portion on the surface of the side facing the substrate,
    wherein the adhesive force of the release layer on the entire perimeter or a part of the peripheral portion is reduced.

9. The supporting member separation method according to claim 1 for separating a laminate having a substrate formed of silicon and a release layer which is altered by absorbing light,
    wherein the adhesive force is reduced by altering the release layer by irradiation with light having a wavelength of 9 μm to 11 μm through the substrate formed of silicon.

10. The supporting member separation method according to claim 1 for separating a laminate having a support formed silicon and a release layer which is altered by absorbing light,
    wherein the adhesive force is reduced by altering the release layer by irradiation with light having a wavelength of 9 μm to 11 μm through the support formed of silicon.

11. The supporting member separation method according to claim 9,
    wherein the release layer is formed by polymerizing reactive polysilsesquioxane by heating.

12. The supporting member separation method according to claim 10,
    wherein the release layer is formed by polymerizing reactive polysilsesquioxane by heating.

13. A supporting member separation method for separating a laminate which is formed by laminating a substrate and a support which supports the substrate through an adhesive layer and in which a release layer is provided on only the peripheral portion on the surface of the side of the substrate facing the support or only the peripheral portion on the surface of the side of the support facing the substrate, the method comprising:
    reducing the adhesive force of at least a part of the release layer which is provided on the peripheral portion of the substrate or the support; and fixing a part of the substrate and the support and separating the support from the substrate by applying a force to another part.

\* \* \* \* \*